(12) United States Patent
Gupta et al.

(10) Patent No.: US 12,412,742 B2
(45) Date of Patent: Sep. 9, 2025

(54) IMPURITY REDUCTION IN SILICON-CONTAINING FILMS

(71) Applicant: Lam Research Corporation, Fremont, CA (US)

(72) Inventors: Awnish Gupta, Hillsboro, OR (US); Bart J. Van Schravendijk, Palo Alto, CA (US); Jason Alexander Varnell, Tigard, OR (US); Joseph R. Abel, West Linn, OR (US); Jennifer Leigh Petraglia, Lake Oswego, OR (US); Adrien LaVoie, Newberg, OR (US)

(73) Assignee: Lam Research Corporation, Fremont, CA (US)

( * ) Notice: Subject to any disclaimer, the term of this patent is extended or adjusted under 35 U.S.C. 154(b) by 348 days.

(21) Appl. No.: 18/003,133

(22) PCT Filed: Jul. 27, 2021

(86) PCT No.: PCT/US2021/070988
§ 371 (c)(1),
(2) Date: Dec. 22, 2022

(87) PCT Pub. No.: WO2022/027016
PCT Pub. Date: Feb. 3, 2022

(65) Prior Publication Data
US 2023/0317449 A1     Oct. 5, 2023

Related U.S. Application Data

(60) Provisional application No. 62/706,033, filed on Jul. 28, 2020.

(51) Int. Cl.
*H01L 21/02*     (2006.01)
*C23C 16/52*     (2006.01)
(Continued)

(52) U.S. Cl.
CPC .......... *H01L 21/0234* (2013.01); *C23C 16/52* (2013.01); *H01J 37/32449* (2013.01);
(Continued)

(58) Field of Classification Search
None
See application file for complete search history.

(56) References Cited

U.S. PATENT DOCUMENTS

| 4,158,717 A | 6/1979 | Nelson |
| 4,419,809 A | 12/1983 | Riseman et al. |

(Continued)

FOREIGN PATENT DOCUMENTS

| CN | 1705768 A | 12/2005 |
| CN | 1732288 A | 2/2006 |

(Continued)

OTHER PUBLICATIONS

Aboaf, J.A. (1969) "Some Properties of Vapor Deposited Silicon Nitride Films Obtained by the Reaction of SiBr4 and NH 3," Journal of the Electrochemical Society, 116(12):1736-1740.

(Continued)

*Primary Examiner* — Asok K Sarkar
(74) *Attorney, Agent, or Firm* — Weaver Austin Villeneuve & Sampson LLP

(57) ABSTRACT

Various embodiments herein relate to methods and apparatus for depositing doped and undoped silicon-containing films having a high degree of purity. In one example, the method includes exposing the substrate to a first reactant and a second reactant; reacting the first and second reactants with one another to form a silicon-containing material and depositing a portion of the silicon-containing film on the substrate; before the silicon-containing film is complete, performing an impurity reduction operation including: (i) generating a plasma from a plasma generation gas comprising inert gas (Continued)

and hydrogen, where the plasma generation gas is substantially free of oxygen, and (ii) exposing the substrate to the plasma to thereby reduce a concentration of fluorine, carbon, hydrogen, and/or nitrogen in the silicon-containing film; and repeating these operations (or a subset thereof) until the silicon-containing film is deposited to a final thickness.

20 Claims, 9 Drawing Sheets

(51) Int. Cl.
 *H01J 37/32* (2006.01)
 *H01L 21/311* (2006.01)
(52) U.S. Cl.
 CPC .. *H01L 21/02164* (2013.01); *H01L 21/02211* (2013.01); *H01L 21/02274* (2013.01); *H01L 21/0228* (2013.01); *H01L 21/31116* (2013.01); *H01J 2237/3321* (2013.01)

(56) References Cited

U.S. PATENT DOCUMENTS

| | | | |
|---|---|---|---|
| 4,500,563 A | 2/1985 | Ellenberger et al. | |
| 4,575,921 A | 3/1986 | Bhagat | |
| 4,869,781 A | 9/1989 | Euen et al. | |
| 5,091,332 A | 2/1992 | Bohr et al. | |
| 5,202,272 A | 4/1993 | Hsieh et al. | |
| 5,230,929 A | 7/1993 | Caporiccio et al. | |
| 5,314,724 A | 5/1994 | Tsukune et al. | |
| 5,459,099 A | 10/1995 | Hsu | |
| 5,496,608 A | 3/1996 | Matsuda et al. | |
| 5,528,719 A | 6/1996 | Yamada | |
| 5,670,432 A | 9/1997 | Tsai | |
| 5,731,235 A | 3/1998 | Srinivasan et al. | |
| 5,854,105 A | 12/1998 | Tseng | |
| 5,856,003 A | 1/1999 | Chiu | |
| 5,891,805 A | 4/1999 | Cheng et al. | |
| 5,976,990 A | 11/1999 | Mercaldi et al. | |
| 6,039,834 A | 3/2000 | Tanaka et al. | |
| 6,080,676 A | 6/2000 | Nguyen et al. | |
| 6,153,519 A | 11/2000 | Jain et al. | |
| 6,197,701 B1 | 3/2001 | Shue et al. | |
| 6,225,175 B1 | 5/2001 | Houston | |
| 6,228,779 B1 | 5/2001 | Bloom et al. | |
| 6,326,322 B1 | 12/2001 | Kim et al. | |
| 6,380,056 B1 | 4/2002 | Shue et al. | |
| 6,395,652 B2 | 5/2002 | Kim et al. | |
| 6,403,416 B1 | 6/2002 | Huang et al. | |
| 6,416,822 B1 | 7/2002 | Chiang et al. | |
| 6,428,859 B1 | 8/2002 | Chiang et al. | |
| 6,448,192 B1 | 9/2002 | Kaushik | |
| 6,518,167 B1 | 2/2003 | You et al. | |
| 6,534,395 B2 | 3/2003 | Werkhoven et al. | |
| 6,548,368 B1 | 4/2003 | Narwankar et al. | |
| 6,632,478 B2 | 10/2003 | Gaillard et al. | |
| 6,632,741 B1 | 10/2003 | Clevenger et al. | |
| 6,638,879 B2 | 10/2003 | Hsieh et al. | |
| 6,645,574 B1 | 11/2003 | Lee et al. | |
| 6,709,928 B1 | 3/2004 | Jenne et al. | |
| 6,730,614 B1 | 5/2004 | Lim et al. | |
| 6,794,284 B2 | 9/2004 | Vaartstra | |
| 6,926,798 B2 | 8/2005 | Biberger et al. | |
| 6,933,245 B2 | 8/2005 | Lee et al. | |
| 6,967,159 B2 | 11/2005 | Vaartstra | |
| 7,019,159 B2 | 3/2006 | Dussarrat et al. | |
| 7,041,335 B2 | 5/2006 | Chung | |
| 7,169,704 B2 | 1/2007 | Koo et al. | |
| 7,172,792 B2 | 2/2007 | Wang et al. | |
| 7,211,525 B1 | 5/2007 | Shanker et al. | |
| 7,294,582 B2 | 11/2007 | Haverkort et al. | |
| 7,297,641 B2 | 11/2007 | Todd et al. | |
| 7,300,885 B2 | 11/2007 | Hasebe et al. | |
| 7,301,210 B2 | 11/2007 | Abadeer et al. | |
| 7,351,668 B2 | 4/2008 | Chou et al. | |
| 7,459,100 B2 | 12/2008 | Kiermasz et al. | |
| 7,462,571 B2 | 12/2008 | Hasebe et al. | |
| 7,465,669 B2 | 12/2008 | Iyer et al. | |
| 7,482,247 B1 | 1/2009 | Papasouliotis et al. | |
| 7,507,676 B2 | 3/2009 | Chou et al. | |
| 7,510,984 B2 | 3/2009 | Saito et al. | |
| 7,514,366 B2 | 4/2009 | Trivedi et al. | |
| 7,611,980 B2 | 11/2009 | Wells et al. | |
| 7,622,369 B1 | 11/2009 | Lee et al. | |
| 7,625,820 B1 | 12/2009 | Papasouliotis et al. | |
| 7,629,267 B2 | 12/2009 | Wan et al. | |
| 7,651,730 B2 | 1/2010 | Hasebe | |
| 7,651,953 B2 | 1/2010 | Todd et al. | |
| 7,651,959 B2 | 1/2010 | Fukazawa et al. | |
| 7,682,657 B2 | 3/2010 | Sherman | |
| 7,700,492 B2 | 4/2010 | Kikuchi | |
| 7,708,859 B2 | 5/2010 | Huang et al. | |
| 7,713,592 B2 | 5/2010 | Nguyen et al. | |
| 7,732,343 B2 | 6/2010 | Niroomand et al. | |
| 7,758,920 B2 | 7/2010 | Hasebe et al. | |
| 7,790,633 B1 | 9/2010 | Tarafdar et al. | |
| 7,807,578 B2 | 10/2010 | Bencher et al. | |
| 7,825,039 B2 | 11/2010 | Takahashi et al. | |
| 7,910,288 B2 | 3/2011 | Abatchev et al. | |
| 7,910,497 B2 | 3/2011 | Olsen et al. | |
| 7,919,416 B2 | 4/2011 | Lee et al. | |
| 7,939,455 B2 | 5/2011 | Clark | |
| 7,964,241 B2 | 6/2011 | Hasebe et al. | |
| 7,964,513 B2 | 6/2011 | Todd et al. | |
| 7,989,365 B2 | 8/2011 | Park et al. | |
| 8,034,673 B2 | 10/2011 | Kadonaga et al. | |
| 8,080,290 B2 | 12/2011 | Hasebe et al. | |
| 8,084,088 B2 | 12/2011 | Huy et al. | |
| 8,088,248 B2 | 1/2012 | Larson | |
| 8,105,901 B2 | 1/2012 | Cheng et al. | |
| 8,119,544 B2 | 2/2012 | Hasebe et al. | |
| 8,129,555 B2 | 3/2012 | Cheng et al. | |
| 8,178,448 B2 | 5/2012 | Nodera et al. | |
| 8,227,032 B2 | 7/2012 | Dussarrat et al. | |
| 8,257,789 B2 | 9/2012 | Matsunaga et al. | |
| 8,298,628 B2 | 10/2012 | Yang et al. | |
| 8,298,954 B1 | 10/2012 | Arnold et al. | |
| 8,366,953 B2 | 2/2013 | Kohno et al. | |
| 8,383,525 B2 | 2/2013 | Raisanen et al. | |
| 8,394,466 B2 | 3/2013 | Hong et al. | |
| 8,580,699 B2 | 11/2013 | Mallick | |
| 8,592,328 B2 | 11/2013 | Hausmann et al. | |
| 8,623,770 B1 | 1/2014 | Gao et al. | |
| 8,669,185 B2 | 3/2014 | Onizawa et al. | |
| 8,703,578 B2 | 4/2014 | Hoentschel et al. | |
| 8,728,955 B2 | 5/2014 | Lavoie et al. | |
| 8,728,956 B2 | 5/2014 | Lavoie et al. | |
| 8,753,984 B2 | 6/2014 | Murakami et al. | |
| 8,791,034 B2 | 7/2014 | Shealy et al. | |
| 8,802,882 B2 | 8/2014 | Wang et al. | |
| 8,846,484 B2 | 9/2014 | Lee et al. | |
| 8,936,977 B2 | 1/2015 | Hoentschel et al. | |
| 8,975,704 B2 | 3/2015 | Hoentschel et al. | |
| 9,023,693 B1 | 5/2015 | Lin et al. | |
| 9,023,737 B2 | 5/2015 | Beynet et al. | |
| 9,070,555 B2 | 6/2015 | Hausmann et al. | |
| 9,095,869 B2 | 8/2015 | Kilpi et al. | |
| 9,214,333 B1 | 12/2015 | Sims et al. | |
| 9,355,839 B2 | 5/2016 | Swaminathan et al. | |
| 9,379,210 B2 | 6/2016 | Mountsier et al. | |
| 9,390,909 B2 | 7/2016 | Pasquale et al. | |
| 9,406,693 B1 | 8/2016 | Pang et al. | |
| 9,443,731 B1 | 9/2016 | O'Meara et al. | |
| 9,472,506 B2 | 10/2016 | Conklin et al. | |
| 9,502,234 B2 | 11/2016 | Xiao et al. | |
| 9,502,238 B2 | 11/2016 | Danek et al. | |
| 9,508,604 B1 | 11/2016 | Sung et al. | |
| 9,530,663 B1 | 12/2016 | Shih et al. | |
| 9,564,312 B2 | 2/2017 | Henri et al. | |
| 9,576,817 B1 | 2/2017 | Cheng et al. | |
| 9,589,790 B2 | 3/2017 | Henri et al. | |
| 9,601,693 B1 | 3/2017 | Henri et al. | |
| 9,611,544 B2 | 4/2017 | Lavoie et al. | |

(56) References Cited

U.S. PATENT DOCUMENTS

| | | |
|---|---|---|
| 9,670,579 B2 | 6/2017 | Hausmann et al. |
| 9,721,784 B2 | 8/2017 | Behera et al. |
| 9,865,455 B1 | 1/2018 | Sims et al. |
| 9,865,815 B2 | 1/2018 | Hausmann |
| 9,875,891 B2 | 1/2018 | Henri et al. |
| 9,892,933 B2 | 2/2018 | Peng et al. |
| 9,905,415 B2 | 2/2018 | Chandra et al. |
| 10,074,543 B2 | 9/2018 | Mahorowala et al. |
| 10,134,579 B2 | 11/2018 | Baldasseroni et al. |
| 10,141,505 B2 | 11/2018 | Hausmann |
| 10,269,559 B2 | 4/2019 | Abel et al. |
| 10,410,872 B2 | 9/2019 | Cheng et al. |
| 10,454,029 B2 | 10/2019 | McKerrow et al. |
| 10,559,465 B2 | 2/2020 | Cheng et al. |
| 10,629,435 B2 | 4/2020 | Swaminathan et al. |
| 10,658,172 B2 | 5/2020 | Abel et al. |
| 10,804,099 B2 | 10/2020 | Henri et al. |
| 10,832,908 B2 | 11/2020 | LaVoie |
| 2001/0028922 A1 | 10/2001 | Sandhu |
| 2002/0001889 A1 | 1/2002 | Kim et al. |
| 2002/0001929 A1 | 1/2002 | Biberger et al. |
| 2002/0066411 A1 | 6/2002 | Chiang et al. |
| 2002/0068466 A1 | 6/2002 | Lee et al. |
| 2003/0034244 A1 | 2/2003 | Yasar et al. |
| 2003/0092280 A1 | 5/2003 | Lee et al. |
| 2003/0116421 A1 | 6/2003 | Xu et al. |
| 2003/0143841 A1 | 7/2003 | Yang et al. |
| 2004/0043570 A1 | 3/2004 | Fujisaki et al. |
| 2004/0077184 A1 | 4/2004 | Anderson et al. |
| 2004/0096582 A1 | 5/2004 | Wang et al. |
| 2005/0025885 A1 | 2/2005 | McSwiney et al. |
| 2005/0042865 A1 | 2/2005 | Cabral, Jr. et al. |
| 2005/0059259 A1 | 3/2005 | O'Meara et al. |
| 2005/0100670 A1 | 5/2005 | Dussarrat et al. |
| 2005/0109276 A1 | 5/2005 | Iyer et al. |
| 2005/0118837 A1 | 6/2005 | Todd et al. |
| 2005/0123690 A1 | 6/2005 | Derderian et al. |
| 2005/0124109 A1 | 6/2005 | Quevedo-Lopez et al. |
| 2005/0142878 A1 | 6/2005 | Jung |
| 2005/0158983 A1 | 7/2005 | Hoshi et al. |
| 2005/0159017 A1 | 7/2005 | Kim et al. |
| 2005/0170104 A1 | 8/2005 | Jung et al. |
| 2005/0196977 A1 | 9/2005 | Saito et al. |
| 2005/0227017 A1 | 10/2005 | Senzaki et al. |
| 2005/0287309 A1 | 12/2005 | Veerasamy |
| 2005/0287775 A1 | 12/2005 | Hasebe et al. |
| 2006/0003557 A1 | 1/2006 | Cabral, Jr. et al. |
| 2006/0008656 A1 | 1/2006 | Veerasamy |
| 2006/0032442 A1 | 2/2006 | Hasebe |
| 2006/0032443 A1 | 2/2006 | Hasebe et al. |
| 2006/0046508 A1 | 3/2006 | Nemani et al. |
| 2006/0084283 A1 | 4/2006 | Paranjpe et al. |
| 2006/0088985 A1 | 4/2006 | Haverkort et al. |
| 2006/0119248 A1 | 6/2006 | Howard et al. |
| 2006/0199357 A1 | 9/2006 | Wan et al. |
| 2006/0263699 A1 | 11/2006 | Abatchev et al. |
| 2006/0273456 A1 | 12/2006 | Sant et al. |
| 2006/0286776 A1 | 12/2006 | Ranish et al. |
| 2006/0289385 A1 | 12/2006 | Kikuchi |
| 2007/0032047 A1 | 2/2007 | Hasebe et al. |
| 2007/0066038 A1 | 3/2007 | Sadjadi et al. |
| 2007/0099431 A1 | 5/2007 | Li |
| 2007/0137572 A1 | 6/2007 | Matsuura et al. |
| 2007/0148350 A1 | 6/2007 | Rahtu et al. |
| 2007/0148968 A1 | 6/2007 | Kwon et al. |
| 2007/0167028 A1 | 7/2007 | Chou et al. |
| 2007/0190782 A1 | 8/2007 | Park |
| 2007/0212850 A1 | 9/2007 | Ingle et al. |
| 2007/0218661 A1 | 9/2007 | Shroff et al. |
| 2007/0238299 A1 | 10/2007 | Niroomand et al. |
| 2007/0238301 A1 | 10/2007 | Cabral et al. |
| 2007/0238316 A1 | 10/2007 | Ohashi |
| 2007/0251444 A1 | 11/2007 | Gros-Jean et al. |
| 2007/0298585 A1 | 12/2007 | Lubomirsky et al. |
| 2008/0038936 A1 | 2/2008 | Todd et al. |
| 2008/0063791 A1 | 3/2008 | Hasebe et al. |
| 2008/0081470 A1 | 4/2008 | Clark |
| 2008/0119057 A1 | 5/2008 | Chua et al. |
| 2008/0124946 A1 | 5/2008 | Xiao et al. |
| 2008/0138996 A1 | 6/2008 | Nishizuka |
| 2008/0139003 A1 | 6/2008 | Pirzada et al. |
| 2008/0142483 A1 | 6/2008 | Hua et al. |
| 2008/0213479 A1 | 9/2008 | Chou et al. |
| 2008/0237726 A1 | 10/2008 | Dyer |
| 2008/0242116 A1 | 10/2008 | Clark |
| 2008/0260969 A1 | 10/2008 | Dussarrat et al. |
| 2008/0274302 A1 | 11/2008 | Hasebe et al. |
| 2008/0311760 A1 | 12/2008 | Nodera et al. |
| 2008/0318443 A1 | 12/2008 | Kim et al. |
| 2009/0018668 A1 | 1/2009 | Galbraith |
| 2009/0035665 A1 | 2/2009 | Tran |
| 2009/0075490 A1 | 3/2009 | Dussarrat |
| 2009/0130797 A1 | 5/2009 | Lee et al. |
| 2009/0146322 A1 | 6/2009 | Weling et al. |
| 2009/0148625 A1 | 6/2009 | Yeom et al. |
| 2009/0155606 A1 | 6/2009 | Yoon et al. |
| 2009/0163041 A1 | 6/2009 | Mungekar et al. |
| 2009/0191722 A1 | 7/2009 | Hasebe et al. |
| 2009/0286381 A1 | 11/2009 | Van Schravendijk et al. |
| 2010/0003797 A1 | 1/2010 | Smith |
| 2010/0038727 A1 | 2/2010 | Chakravarthi et al. |
| 2010/0099271 A1 | 4/2010 | Hausmann et al. |
| 2010/0102407 A1 | 4/2010 | Kajiyama et al. |
| 2010/0124618 A1 | 5/2010 | Kobayashi et al. |
| 2010/0124621 A1 | 5/2010 | Kobayashi et al. |
| 2010/0136260 A1 | 6/2010 | Matsunaga et al. |
| 2010/0136313 A1 | 6/2010 | Shimizu et al. |
| 2010/0151681 A1 | 6/2010 | Knapp et al. |
| 2010/0221925 A1 | 9/2010 | Lee et al. |
| 2010/0267238 A1 | 10/2010 | Johnson et al. |
| 2010/0304047 A1 | 12/2010 | Yang et al. |
| 2010/0304574 A1 | 12/2010 | Nodera et al. |
| 2010/0310791 A1 | 12/2010 | Shimazu et al. |
| 2011/0003477 A1 | 1/2011 | Park et al. |
| 2011/0014795 A1 | 1/2011 | Lee et al. |
| 2011/0021010 A1 | 1/2011 | Cheng et al. |
| 2011/0086516 A1 | 4/2011 | Lee et al. |
| 2011/0127582 A1 | 6/2011 | Cheng et al. |
| 2011/0129978 A1 | 6/2011 | Cheng et al. |
| 2011/0151142 A1 | 6/2011 | Seamons et al. |
| 2011/0159673 A1 | 6/2011 | Hanawa et al. |
| 2011/0176967 A1 | 7/2011 | Okuda et al. |
| 2011/0183528 A1 | 7/2011 | Wang et al. |
| 2011/0223769 A1 | 9/2011 | Ko et al. |
| 2011/0244142 A1 | 10/2011 | Cheng et al. |
| 2011/0256734 A1 | 10/2011 | Hausmann et al. |
| 2011/0262642 A1 | 10/2011 | Xiao et al. |
| 2012/0009802 A1 | 1/2012 | Lavoie et al. |
| 2012/0009803 A1 | 1/2012 | Jung et al. |
| 2012/0011889 A1 | 1/2012 | Bogdahn et al. |
| 2012/0028469 A1 | 2/2012 | Onizawa et al. |
| 2012/0058282 A1 | 3/2012 | Hong et al. |
| 2012/0068347 A1 | 3/2012 | Isobayashi et al. |
| 2012/0088369 A1 | 4/2012 | Weidman et al. |
| 2012/0104347 A1 | 5/2012 | Quick |
| 2012/0108079 A1 | 5/2012 | Mahajani |
| 2012/0115074 A1 | 5/2012 | Zhang et al. |
| 2012/0142194 A1 | 6/2012 | Hwang |
| 2012/0156882 A1 | 6/2012 | Lee et al. |
| 2012/0156888 A1 | 6/2012 | Sato et al. |
| 2012/0164846 A1 | 6/2012 | Ha et al. |
| 2012/0171846 A1 | 7/2012 | Hwang |
| 2012/0177841 A1 | 7/2012 | Thompson |
| 2012/0213940 A1 | 8/2012 | Mallick |
| 2012/0244711 A1 | 9/2012 | Yin et al. |
| 2012/0264305 A1 | 10/2012 | Nakano |
| 2012/0282418 A1 | 11/2012 | Chou et al. |
| 2012/0315394 A1 | 12/2012 | Ito |
| 2013/0040447 A1 | 2/2013 | Swaminathan et al. |
| 2013/0065404 A1 | 3/2013 | Weidman et al. |
| 2013/0071580 A1 | 3/2013 | Weidman et al. |
| 2013/0084688 A1 | 4/2013 | O'Meara et al. |
| 2013/0113073 A1 | 5/2013 | Liu et al. |
| 2013/0115783 A1 | 5/2013 | Kim et al. |

(56) References Cited

U.S. PATENT DOCUMENTS

| | | |
|---|---|---|
| 2013/0129940 A1 | 5/2013 | Xiao et al. |
| 2013/0189845 A1 | 7/2013 | Kim et al. |
| 2013/0189854 A1 | 7/2013 | Hausmann et al. |
| 2013/0196082 A1 | 8/2013 | Spence et al. |
| 2013/0200384 A1 | 8/2013 | Mieno |
| 2013/0210236 A1 | 8/2013 | Ogihara et al. |
| 2013/0252437 A1 | 9/2013 | Sano et al. |
| 2013/0273704 A1 | 10/2013 | Jee et al. |
| 2013/0280919 A1 | 10/2013 | Yuasa et al. |
| 2013/0302980 A1 | 11/2013 | Chandrashekar et al. |
| 2013/0327636 A1 | 12/2013 | Majetich et al. |
| 2013/0344248 A1 | 12/2013 | Clark |
| 2014/0023794 A1 | 1/2014 | Mahajani et al. |
| 2014/0099797 A1 | 4/2014 | Terasaki |
| 2014/0113455 A1 | 4/2014 | Reimer et al. |
| 2014/0113457 A1 | 4/2014 | Sims et al. |
| 2014/0120737 A1 | 5/2014 | Swaminathan et al. |
| 2014/0134812 A1 | 5/2014 | Kim et al. |
| 2014/0141625 A1 | 5/2014 | Fukazawa et al. |
| 2014/0141626 A1 | 5/2014 | Hausmann et al. |
| 2014/0158580 A1 | 6/2014 | Xiao et al. |
| 2014/0170853 A1 | 6/2014 | Shamma et al. |
| 2014/0193983 A1 | 7/2014 | LaVoie |
| 2014/0216337 A1 | 8/2014 | Swaminathan et al. |
| 2014/0262038 A1 | 9/2014 | Wang et al. |
| 2014/0273477 A1 | 9/2014 | Niskanen et al. |
| 2014/0273528 A1 | 9/2014 | Niskanen et al. |
| 2014/0273529 A1 | 9/2014 | Nguyen et al. |
| 2014/0273530 A1 | 9/2014 | Nguyen et al. |
| 2014/0273531 A1 | 9/2014 | Niskanen et al. |
| 2014/0302686 A1 | 10/2014 | Pan et al. |
| 2015/0004805 A1 | 1/2015 | Omstead et al. |
| 2015/0021712 A1 | 1/2015 | Zschaetzsch et al. |
| 2015/0031218 A1 | 1/2015 | Karakawa |
| 2015/0056540 A1 | 2/2015 | Fukuda |
| 2015/0126042 A1 | 5/2015 | Pasquale et al. |
| 2015/0132965 A1 | 5/2015 | Devilliers et al. |
| 2015/0137061 A1 | 5/2015 | Donghi et al. |
| 2015/0155198 A1 | 6/2015 | Tsai et al. |
| 2015/0162416 A1 | 6/2015 | Chang et al. |
| 2015/0167163 A1 | 6/2015 | Kubota et al. |
| 2015/0200110 A1 | 7/2015 | Li et al. |
| 2015/0217330 A1 | 8/2015 | Haukka et al. |
| 2015/0243708 A1 | 8/2015 | Ravasio et al. |
| 2015/0249153 A1 | 9/2015 | Morin et al. |
| 2015/0251917 A1 | 9/2015 | Hong et al. |
| 2015/0259791 A1 | 9/2015 | Hausmann et al. |
| 2015/0315704 A1 | 11/2015 | Nakano et al. |
| 2016/0020092 A1 | 1/2016 | Kang et al. |
| 2016/0042950 A1 | 2/2016 | Dai et al. |
| 2016/0046501 A1 | 2/2016 | Kverel et al. |
| 2016/0049307 A1 | 2/2016 | Chen |
| 2016/0064224 A1 | 3/2016 | Hung et al. |
| 2016/0079054 A1 | 3/2016 | Chen et al. |
| 2016/0093484 A1 | 3/2016 | Marsh |
| 2016/0099143 A1 | 4/2016 | Yan et al. |
| 2016/0109804 A1 | 4/2016 | Huli |
| 2016/0111297 A1 | 4/2016 | Chen et al. |
| 2016/0148799 A1 | 5/2016 | Wang et al. |
| 2016/0148800 A1 | 5/2016 | Henri et al. |
| 2016/0148806 A1 | 5/2016 | Henri et al. |
| 2016/0155739 A1 | 6/2016 | Ting et al. |
| 2016/0163557 A1 | 6/2016 | Hudson et al. |
| 2016/0172194 A1 | 6/2016 | Kunnen et al. |
| 2016/0190008 A1 | 6/2016 | Chandrashekar et al. |
| 2016/0225640 A1 | 8/2016 | Raley et al. |
| 2016/0247678 A1 | 8/2016 | Feng et al. |
| 2016/0247680 A1 | 8/2016 | O'Meara et al. |
| 2016/0254171 A1 | 9/2016 | Shamma et al. |
| 2016/0284539 A1 | 9/2016 | Horita et al. |
| 2016/0284567 A1 | 9/2016 | Reilly et al. |
| 2016/0293398 A1 | 10/2016 | Danek et al. |
| 2016/0293418 A1 | 10/2016 | Pasquale et al. |
| 2016/0300718 A1 | 10/2016 | Raley et al. |
| 2016/0329238 A1 | 11/2016 | Tang et al. |
| 2016/0336178 A1 | 11/2016 | Swaminathan et al. |
| 2016/0336187 A1 | 11/2016 | Liou et al. |
| 2016/0343580 A1 | 11/2016 | Hudson |
| 2016/0365425 A1 | 12/2016 | Chen et al. |
| 2016/0372334 A1 | 12/2016 | Mignot et al. |
| 2017/0069510 A1 | 3/2017 | Kal et al. |
| 2017/0092496 A1 | 3/2017 | Devilliers |
| 2017/0092857 A1 | 3/2017 | Hausmann |
| 2017/0110550 A1 | 4/2017 | Tsai et al. |
| 2017/0117134 A1 | 4/2017 | Henri et al. |
| 2017/0148637 A1 | 5/2017 | Devilliers |
| 2017/0170015 A1 | 6/2017 | Kim et al. |
| 2017/0170026 A1 | 6/2017 | Hudson et al. |
| 2017/0207082 A1 | 7/2017 | Wang et al. |
| 2017/0323785 A1 | 11/2017 | Singhal et al. |
| 2017/0323803 A1 | 11/2017 | Van Schravendijk et al. |
| 2017/0358450 A1 | 12/2017 | Ko et al. |
| 2018/0005814 A1 | 1/2018 | Kumar et al. |
| 2018/0033622 A1 | 2/2018 | Swaminathan et al. |
| 2018/0061628 A1 | 3/2018 | Ou et al. |
| 2018/0061650 A1 | 3/2018 | Mahorowala et al. |
| 2018/0076023 A1 | 3/2018 | Yan et al. |
| 2018/0102245 A1 | 4/2018 | Sims et al. |
| 2018/0114903 A1 | 4/2018 | Hausmann |
| 2018/0138028 A1 | 5/2018 | Henri et al. |
| 2018/0138036 A1 | 5/2018 | Baldasseroni et al. |
| 2018/0138040 A1 | 5/2018 | LaVoie |
| 2018/0138405 A1 | 5/2018 | McKerrow et al. |
| 2018/0223429 A1 | 8/2018 | Fukazawa et al. |
| 2018/0265973 A1 | 9/2018 | Firouzdor et al. |
| 2018/0308695 A1 | 10/2018 | LaVoie et al. |
| 2018/0347035 A1 | 12/2018 | Weimer et al. |
| 2019/0027362 A1 | 1/2019 | Cheng et al. |
| 2019/0041756 A1 | 2/2019 | Hasebe et al. |
| 2019/0055645 A1 | 2/2019 | Li et al. |
| 2019/0080903 A1 | 3/2019 | Abel et al. |
| 2019/0206677 A1 | 7/2019 | Abel et al. |
| 2019/0279866 A1 | 9/2019 | Pore |
| 2019/0284694 A1 | 9/2019 | Knisley et al. |
| 2019/0333753 A1 | 10/2019 | Ueda et al. |
| 2019/0345608 A1 | 11/2019 | Agarwal et al. |
| 2020/0032389 A1 | 1/2020 | Lei et al. |
| 2020/0105509 A1 | 4/2020 | Drewery et al. |
| 2020/0190664 A1 | 6/2020 | Hu et al. |
| 2020/0227314 A1 | 7/2020 | Kim et al. |
| 2020/0381623 A1 | 12/2020 | Qi et al. |
| 2021/0082685 A1 | 3/2021 | Kataoka et al. |
| 2021/0301400 A1 | 9/2021 | Lee et al. |
| 2021/0384029 A1 | 12/2021 | Fields et al. |
| 2022/0037144 A1 | 2/2022 | Rao et al. |
| 2022/0275510 A1 | 9/2022 | Gupta et al. |
| 2023/0220544 A1 | 7/2023 | Gupta et al. |
| 2023/0245896 A1 | 8/2023 | Gupta et al. |
| 2024/0087883 A1* | 3/2024 | Matsuki ............ H01L 21/02274 |
| 2024/0327973 A1 | 10/2024 | Kumar et al. |
| 2024/0355624 A1 | 10/2024 | Yang et al. |
| 2024/0410053 A1 | 12/2024 | Gupta et al. |
| 2025/0014890 A1 | 1/2025 | Gupta et al. |
| 2025/0014893 A1 | 1/2025 | Agnew et al. |
| 2025/0019827 A1* | 1/2025 | Yeon ..................... C23C 16/04 |
| 2025/0054751 A1 | 2/2025 | Gupta et al. |
| 2025/0069882 A1 | 2/2025 | Gupta et al. |

FOREIGN PATENT DOCUMENTS

| | | |
|---|---|---|
| CN | 1841676 A | 10/2006 |
| CN | 101006195 A | 7/2007 |
| CN | 101255548 A | 9/2008 |
| CN | 101328578 A | 12/2008 |
| CN | 101378007 A | 3/2009 |
| CN | 101506955 A | 8/2009 |
| CN | 101981225 A | 2/2011 |
| CN | 102224573 A | 10/2011 |
| CN | 102471885 A | 5/2012 |
| CN | 102479672 A | 5/2012 |
| CN | 102906305 A | 1/2013 |
| CN | 103168344 A | 6/2013 |
| CN | 103225071 A | 7/2013 |
| CN | 103403847 A | 11/2013 |

(56) References Cited

FOREIGN PATENT DOCUMENTS

| | | |
|---|---|---|
| CN | 103515197 A | 1/2014 |
| CN | 103632955 A | 3/2014 |
| CN | 103635605 A | 3/2014 |
| CN | 103918068 A | 7/2014 |
| CN | 104046955 A | 9/2014 |
| CN | 104272441 A | 1/2015 |
| CN | 104517892 A | 4/2015 |
| CN | 104576506 A | 4/2015 |
| CN | 104752199 A | 7/2015 |
| CN | 105448701 A | 3/2016 |
| CN | 205164805 U | 4/2016 |
| CN | 105609471 A | 5/2016 |
| CN | 105789027 A | 7/2016 |
| CN | 105917445 A | 8/2016 |
| CN | 105977141 A | 9/2016 |
| CN | 106057637 A | 10/2016 |
| CN | 106449360 A | 2/2017 |
| CN | 108411281 A | 8/2018 |
| CN | 109791875 A | 5/2019 |
| EP | 0277766 A2 | 8/1988 |
| EP | 2278046 A1 | 1/2011 |
| GB | 1181559 A | 2/1970 |
| JP | 2005011904 A | 1/2005 |
| JP | 2005136300 A | 5/2005 |
| JP | 2005163084 A | 6/2005 |
| JP | 2005210076 A | 8/2005 |
| JP | 2006060091 A | 3/2006 |
| JP | 2006080359 A | 3/2006 |
| JP | 2007154297 A | 6/2007 |
| JP | 2007281181 A | 10/2007 |
| JP | 2008517479 A | 5/2008 |
| JP | 2008160123 A | 7/2008 |
| JP | 2008306093 A | 12/2008 |
| JP | 2009010318 A | 1/2009 |
| JP | 2009170823 A | 7/2009 |
| JP | 2010010497 A | 1/2010 |
| JP | 2010087187 A | 4/2010 |
| JP | 2010527138 A | 8/2010 |
| JP | 2010232214 A | 10/2010 |
| JP | 2010239103 A | 10/2010 |
| JP | 2010283388 A | 12/2010 |
| JP | 2011035366 A | 2/2011 |
| JP | 2011192776 A | 9/2011 |
| JP | 2012084707 A | 4/2012 |
| JP | 2012142574 A | 7/2012 |
| JP | 2012169408 A | 9/2012 |
| JP | 2012221978 A | 11/2012 |
| JP | 5225081 B2 | 7/2013 |
| JP | 2013153164 A | 8/2013 |
| JP | 2013182951 A | 9/2013 |
| JP | 2013225655 A | 10/2013 |
| JP | 2014038968 A | 2/2014 |
| JP | 2014179607 A | 9/2014 |
| JP | 2014532304 A | 12/2014 |
| JP | 2015029097 A | 2/2015 |
| JP | 2015512568 A | 4/2015 |
| JP | 2015159335 A | 9/2015 |
| JP | 2016184685 A | 10/2016 |
| JP | 2017130665 A | 7/2017 |
| KR | 20010075177 A | 8/2001 |
| KR | 20060023137 A | 3/2006 |
| KR | 20070088512 A | 8/2007 |
| KR | 100861851 B1 | 10/2008 |
| KR | 20090033449 A | 4/2009 |
| KR | 20090080019 A | 7/2009 |
| KR | 20090119661 A | 11/2009 |
| KR | 20090131821 A | 12/2009 |
| KR | 20100027062 A | 3/2010 |
| KR | 20100128863 A | 12/2010 |
| KR | 20120098448 A | 9/2012 |
| KR | 20130049690 A | 5/2013 |
| KR | 20130062256 A | 6/2013 |
| KR | 20130135087 A | 12/2013 |
| KR | 20140069326 A | 6/2014 |
| KR | 20140079431 A | 6/2014 |
| KR | 20140126241 A | 10/2014 |
| KR | 20140141686 A | 12/2014 |
| KR | 20150025224 A | 3/2015 |
| KR | 20150053253 A | 5/2015 |
| KR | 20150103642 A | 9/2015 |
| KR | 20160033057 A | 3/2016 |
| KR | 20160045527 A | 4/2016 |
| KR | 20160068002 A | 6/2016 |
| KR | 101884555 B1 | 8/2018 |
| KR | 20200086582 A | 7/2020 |
| KR | 20210014483 A | 2/2021 |
| KR | 102407031 B1 | 6/2022 |
| TW | 483103 B | 4/2002 |
| TW | 200733215 A | 9/2007 |
| TW | 201033739 A | 9/2010 |
| TW | 201430951 A | 8/2014 |
| TW | 201439105 A | 10/2014 |
| TW | 201606855 A | 2/2016 |
| TW | 201623682 A | 7/2016 |
| TW | 201736633 A | 10/2017 |
| TW | 201835374 A | 10/2018 |
| TW | 202014546 A | 4/2020 |
| WO | WO-2006018441 A1 | 2/2006 |
| WO | WO-2006026350 A2 | 3/2006 |
| WO | WO-2011130397 A2 | 10/2011 |
| WO | WO-2012061593 A2 | 5/2012 |
| WO | WO-2012066977 A1 | 5/2012 |
| WO | WO-2012165166 A1 | 12/2012 |
| WO | WO-2013043330 A1 | 3/2013 |
| WO | WO-2013066667 A1 | 5/2013 |
| WO | WO-2013137115 A1 | 9/2013 |
| WO | WO-2013148880 A1 | 10/2013 |
| WO | WO-2014030393 A1 | 2/2014 |
| WO | WO-2020131635 A1 | 6/2020 |
| WO | WO-2021025874 A1 | 2/2021 |

OTHER PUBLICATIONS

Becker, F.S. and Rohl, S. (Nov. 1987) "Low Pressure Deposition of Doped SiO2 by Pyrolysis of Tetraethylorthosilicate (TEOS)," J. Electrochem. Soc.: Solid-State Science and Technology, 134(11):2923-2931.

Cecchi et al., (2007) "Ultra-thin conformal pore-sealing of low-k materials by plasma-assisted ALD," University of New Mexico, Albuquerque, NM, Sandia National Labs, Albuquerque, NM, 1 page.

Chinese First Office Action dated Apr. 12, 2021 issued in Application No. CN 201711112653.9.

Chinese First Office Action dated Jul. 31, 2020 issued in Application No. CN 201710636255.0.

Chinese First Office Action dated Jun. 23, 2020 issued in Application No. CN 201811075877.1.

Chinese First Office Action dated Mar. 30, 2018 issued in Application No. CN 201610206201.6.

Chinese First Office Action dated May 19, 2016 issued in Application No. CN 201310021460.8.

Chinese First Office Action dated Nov. 13, 2020 issued in Application No. CN 201710772400.8.

Chinese First Office Action dated Nov. 8, 2017 issued in Application No. CN 201510615853.0.

Chinese Fourt Office Action dated May 16, 2018 issued in Application No. CN 201310021460.8.

Chinese Notification of Reexamination dated Apr. 17, 2020 issued in Application No. CN 201310021460.8.

Chinese Second Office Action dated Apr. 13, 2017 issued in Application No. CN 201310021460.8.

Chinese Second Office Action dated Jan. 24, 2019 issued in Application No. CN 201610206201.6.

Chinese Second Office Action dated Mar. 15, 2021 issued in Application No. CN 201811075877.1.

Chinese Third Office Action dated Oct. 17, 2017 issued in Application No. CN 201310021460.8.

CN Office Action dated Jun. 29, 2023 in Application No. CN201780070122.X with English Translation.

(56) References Cited

OTHER PUBLICATIONS

CN Office Action dated Mar. 7, 2022, in Application No. CN201711112653.9 with English translation.
CN Office Action dated Mar. 15, 2023 in Application No. CN201780070122.X with EnglishTranslation.
CN Office Action dated Mar. 30, 2023, in Application No. CN201880073124.9 with English translation.
CN Office Action dated Nov. 19, 2021, in application No. CN201711112653 with English translation.
CN Office Action dated Oct. 8, 2022 in Application No. CN201780070122.X with English Translation.
CN Office Action dated Sep. 16, 2022, in Application No. CN201780070305.1 with English translation.
CN Office Action dated Sep. 2, 2021, in application No. CN201811075877.1 with English translation.
CN Office Action dated Sep. 21, 2023, in Application No. CN201880073124.9 with English translation.
European Examination Report dated Dec. 11, 2017 issued in Application No. EP 13 15 2046.
European Extended Search Report dated Apr. 14, 2014 issued in Application No. EP13152046.2.
Huang et al. (2017) "Design of efficient mono-aminosilane precursors for atomic layer deposition of SiO2 thin films," Royal Society of Chemistry Adv. Jul. 2017:22672-22678.
International Preliminary Report on Patentability dated Dec. 15, 2022 from PCT/US2021/035269.
International Preliminary Report on Patentability dated Feb. 9, 2023 in PCT Application No. PCT/US2021/070988.
International Preliminary Report on Patentability dated Feb. 17, 2022 in PCT Application No. PCT/US2020/043459.
International Preliminary Report on Patentability dated Mar. 26, 2020 issued in Application No. PCT/US2018/050049.
International Preliminary Report on Patentability dated May 23, 2019 issued in Application No. PCT/US17/60692.
International Preliminary Report on Patentability dated May 23, 2019 issued in Application No. PCT/US2017/060240.
International Search Report and Written Opinion dated Apr. 14, 2023 in PCT Application No. PCT/US2022/080683.
International Search Report and Written Opinion dated Apr. 28, 2023, in Application No. PCT/US2022/081972.
International Search Report and Written Opinion dated Dec. 2, 2022 in PCT Application No. PCT/US2022/075296.
International Search Report and Written Opinion dated Feb. 13, 2018 issued in Application No. PCT/US2017/060692.
International Search Report and Written Opinion dated Feb. 21, 2018 issued in Application No. PCT/US2017/060240.
International Search Report and Written Opinion dated Feb. 25, 2019 issued in Application No. PCT/US2018/050049.
International Search Report and Written Opinion dated Nov. 11, 2020 issued in Application No. PCT/US2020/043459.
International Search Report and Written Opinion dated Nov. 17, 2021, in PCT Application No. PCT/US2021/070988.
International Search Report and Written Opinion dated Sep. 23, 2021 in PCT Application No. PCT/US2021/035269.
Japanese Decision of Rejection dated Jan. 9, 2018 issued in Application No. JP 2013-007612.
Japanese First Office Action dated Dec. 1, 2020 issued in Application No. JP 2016-185454.
Japanese First Office Action dated May 28, 2019 issued in Application No. JP 2017-143195.
Japanese First Office Action dated May 29, 2019 issued in Application No. JP 2018-090402.
Japanese First Office Action dated Oct. 8, 2019 issued in Application No. JP 2015-184688.
Japanese Notice of Allowance Apr. 28, 2020 issued in Application No. JP 2015-184688.
Japanese Office Action dated Jan. 10, 2017 issued in Application No. JP 2013-007612.
Japanese Reason for Refusal dated Apr. 2, 2019 issued in Application No. JP 2013-007612.
Japanese Second Office Action dated Dec. 24, 2019 issued in Application No. JP 2017-143195.
Japanese Second Office Action [Decision of Rejection] dated Jan. 14, 2020 issued in Application No. JP 2018-090402.
Japanese Third Office Action dated Aug. 25, 2020 issued in Application No. JP 2017-143195.
JP Office Action dated Oct. 18, 2022, in Application No. JP2020-514992 with English translation.
King, Sean W., (Jul./Aug. 2011) "Plasma enhanced atomic layer deposition of SiNx:H and SiO2," J. Vac. Sci. Technol. A29(4):041501-1 through 041501-9 (9 pages).
Korean Decision from the Patent Tribunal of the KIPO (description) dated May 26, 2015 issued in Application No. KR 10-2012-0043797.
Korean Final Office Action dated Aug. 18, 2014 issued in Application No. KR 10-2012-0043797.
Korean First Office Action dated Nov. 27, 2019 issued in Application No. KR 10-2017-0093932.
Korean Notice of Provisional Rejection dated Dec. 6, 2013 issued in Application No. KR 10-2012-0043797.
Korean Second Office Action dated Oct. 27, 2020 issued in Application No. KR 10-2017-0093932.
KR Office Action dated Jul. 5, 2022 in Application No. KR10-2015-0163065 with English translation.
KR office action dated Apr. 24, 2022 in Application No. KR10-2015-0133942 with English Translation.
KR Office action dated Aug. 8, 2022 in KR Application No. KR10-2015-0162556 with English translation.
KR Office Action dated Aug. 17, 2023, in application No. KR10-2016-0039946 with English translation.
KR Office Action dated Aug. 30, 2023, in Application No. KR10-2020-7010492 with English Translation.
KR Office action dated Feb. 24, 2023 in KR Application No. KR10-2015-0162556 with English translation.
KR Office Action dated Jan. 5, 2023 in Application No. KR10-2016-0039946 with English translation.
KR Office Action dated Jan. 12, 2022 in Application No. KR1020150163065 with English translation.
KR Office Action dated Jan. 26, 2022, in Application No. 10-2019-7016749 with English translation.
KR Office Action dated Jul. 12, 2022 in Application No. KR20197016749 With English translation.
KR Office Action dated Jul. 14, 2023, in application No. KR10-2022-7018901 with English translation.
KR Office Action dated Jul. 20, 2022, in Application No. KR10-2017-0147904 with English translation.
KR Office Action dated Jun. 7, 2022 in Application No. KR20210086044 with English translation.
KR Office Action dated Jun. 10, 2022, in Application No. KR1020170109223 with English translation.
KR Office Action dated Mar. 31, 2023, in Application No. KR10-2016-0122046 with English translation.
KR Office Action dated Mar. 4, 2022, in Application No. KR10-2019-7017087 with English Translation.
KR Office Action dated Nov. 4, 2022 in Application No. KR10-2022-7018901 with English translation.
KR Office Action dated Nov. 30, 2021 in Application No. KR10-2019-7017087 with English Translation.
KR Office Action dated Oct. 6, 2022, in Application No. KR10-2015-0133942 with English Translation.
KR Office Action dated Sep. 6, 2022, in Application No. KR10-2017-0109223 with English translation.
KR Office Action dated Sep. 27, 2021, in application No. KR20210086044 with English translation.
KR Office Action dated Sep. 29, 2021, in application No. KR1020170109223 with English translation.
Kunnen, E. et al., "A way to integrate multiple block layers for middle of line contact patterning", in Advanced Etch Technology for Nanopatterning IV, Edited by Qinghuam Lin and Sebastian Engelmann, Mar. 17, 2015, Proc. of SPIE, vol. 9428, 94280W1-8, 8 pages. [Downloaded on Jun. 27, 17 from http://proceedings.spiedigitallibrary.org ].

(56) References Cited

OTHER PUBLICATIONS

Lin et al., (1998) "Silicon Nitride Films Deposited By Atmospheric Pressure Chemical Vapor Deposition," Materials Research Society Symposium Proceedings vol. 495, Chemical Aspects of Electronic Ceramics Processing, Symposium held Nov. 30-Dec. 4, 1997, Boston, Massachusetts, U.S.A., 8 pages.
PCT International Preliminary Report on Patentability and Written Opinion, dated Oct. 26, 2012, issued in PCT/US2011/032303.
PCT International Search Report and Written Opinion, dated Feb. 20, 2012, issued in PCT/US2011/032303.
PCT Invitation to Pay Additional Fees; Communication Re Partial International Search, dated Dec. 16, 2011, issued in Application No. PCT/US2011/032303.
Plasma Enhanced Atomic Layer Deposition (PEALD), Website: http://www.asm.com/index.php?option=com_content&task=view&id=19&Itemid=161 (2010), 1 page.
"PlasmaProTM NGP® 80 Range," Oxford Instruments (2010), 8 pages.
Singapore Notice of Eligibility for Grant and Supplemental Examination Report dated Jan. 20, 2020 issued in Application No. SG 10201507848X.
Taiwan Examination Report dated Mar. 29, 2017 issued in Application No. TW 102102054.
Taiwan First Office Action dated Feb. 27, 2019, issued in Application No. TW 106124691.
Taiwan First Office Action dated Oct. 16, 2019 issued in Application No. TW 105109955.
Taiwanese First Decision of Refusal dated Dec. 22, 2020 issued in Application No. TW 1051305401.
Taiwanese First Office Action dated Apr. 25, 2019 issued in Application No. TW 104131344.
Taiwanese First Office Action dated Jun. 13, 2019 issued in Application No. TW 104138370.
Taiwanese First Office Action dated Mar. 25, 2020 issued in Application No. TW 105130541.
Taiwanese Notice of Allowance dated Feb. 17, 2019 issued in Application No. TW 104138370.
TW Office Action dated Jun. 17, 2022 in Application No. TW107131673 With English Translation.
US Advisory Action dated May 20, 2019 issued in U.S. Appl. No. 15/349,746.
U.S. Appl. No. 16/852,261, inventors Abel et al., filed Apr. 17, 2020.
US Final Office Action dated Apr. 20, 2018 issued in U.S. Appl. No. 15/349,753.
US Final Office Action dated Apr. 25, 2013 issued in U.S. Appl. No. 13/084,305.
US Final Office Action dated Apr. 9, 2018 issued in U.S. Appl. No. 15/279,312.
US Final Office Action dated Dec. 21, 2018 issued in U.S. Appl. No. 15/349,746.
US Final Office Action dated Feb. 5, 2020 issued in U.S. Appl. No. 15/349,746.
U.S. Final Office Action dated Jan. 2, 2018 issued in U.S. Appl. No. 15/351,221.
US Final Office Action dated Jan. 18, 2018 issued in U.S. Appl. No. 15/349,746.
US Final Office Action dated Jan. 21, 2020 issued in U.S. Appl. No. 15/847,744.
US Final Office Action dated Nov. 14, 2014 issued in U.S. Appl. No. 14/065,334.
US Final Office Action dated Oct. 19, 2017 issued in U.S. Appl. No. 15/279,314.
U.S. Non-Final Office Action dated Jul. 5, 2017 issued in U.S. Appl. No. 15/351,221.
U.S. Non-Final Office Action dated Jul. 7, 2023, in U.S. Appl. No. 17/632,074.
US Notice of Allowance dated Apr. 25, 2018 issued in U.S. Appl. No. 15/253,546.
US Notice of Allowance dated Aug. 18, 2015 issued in U.S. Appl. No. 14/494,914.
US Notice of Allowance dated Dec. 11, 2019 issued in U.S. Appl. No. 15/279,312.
US Notice of Allowance dated Dec. 5, 2018 issued in U.S. Appl. No. 15/703,917.
US Notice of Allowance dated Feb. 1, 2016 issued in U.S. Appl. No. 14/552,245.
US Notice of Allowance dated Feb. 17, 2015 issued in U.S. Appl. No. 14/065,334.
US Notice of Allowance dated Feb. 8, 2017 issued in U.S. Appl. No. 14/713,639.
US Notice of Allowance dated Jan. 15, 2020 issued in U.S. Appl. No. 16/294,783.
US Notice of Allowance dated Jul. 1, 2020 issued in U.S. Appl. No. 15/349,746.
US Notice of Allowance dated Jul. 15, 2016 issued in U.S. Appl. No. 14/678,736.
U.S. Notice of Allowance dated Jul. 16, 2018 issued in U.S. Appl. No. 15/351,221.
US Notice of Allowance dated Jul. 26, 2013, issued U.S. Appl. No. 13/414,619.
US Notice of Allowance dated Jul. 26, 2018 issued in U.S. Appl. No. 15/829,702.
US Notice of Allowance dated Jun. 17, 2019 issued in U.S. Appl. No. 15/349,753.
US Notice of Allowance dated May 28, 2020 issued in U.S. Appl. No. 15/847,744.
US Notice of Allowance dated Oct. 26, 2016 issued in U.S. Appl. No. 14/552,245.
US Notice of Allowance dated Sep. 1, 2017 issued in U.S. Appl. No. 15/272,222.
US Notice of Allowance dated Sep. 19, 2016 issued in U.S. Appl. No. 14/935,317.
US Notice of Allowance dated Sep. 26, 2016 issued in U.S. Appl. No. 14/552,011.
US Notice of Allowance dated Sep. 28, 2017 issued in U.S. Appl. No. 15/399,637.
US Office Action dated Apr. 11, 2014 issued in U.S. Appl. No. 14/065,334.
US Office Action dated Apr. 18, 2016 issued in U.S. Appl. No. 14/935,317.
US Office Action dated Apr. 18, 2019 issued in U.S. Appl. No. 15/279,312.
US Office Action dated Apr. 7, 2017 issued in U.S. Appl. No. 15/279,314.
US Office Action dated Jul. 14, 2017 issued in U.S. Appl. No. 15/349,746.
US Office Action dated Jul. 18, 2018 issued in U.S. Appl. No. 15/703,917.
US Office Action dated Jul. 30, 2019 issued in U.S. Appl. No. 15/847,744.
US Office Action dated Jun. 14, 2019 issued in U.S. Appl. No. 15/349,746.
US Office Action dated Jun. 29, 2017 issued in U.S. Appl. No. 15/279,312.
US Office Action dated Jun. 29, 2018 issued in U.S. Appl. No. 15/349,746.
US Office Action dated Jun. 7, 2013 issued U.S. Appl. No. 13/414,619.
US Office Action dated May 19, 2017 issued in U.S. Appl. No. 15/272,222.
US Office Action dated May 24, 2016 issued in U.S. Appl. No. 14/552,245.
US Office Action dated May 25, 2016 issued in U.S. Appl. No. 14/552,011.
US Office Action dated Oct. 1, 2015 issued in U.S. Appl. No. 14/552,245.
US Office Action dated Oct. 23, 2017 issued in U.S. Appl. No. 15/349,753.
US Office Action dated Oct. 6, 2017 issued in U.S. Appl. No. 15/253,546.
US Office Action dated Sep. 14, 2012 issued in U.S. Appl. No. 13/084,305.
US Office Action dated Sep. 28, 2018 issued in U.S. Appl. No. 15/349,753.

(56) References Cited

OTHER PUBLICATIONS

U.S. Restriction requirement dated Apr. 20, 2023 in U.S. Appl. No. 17/632,074.
Wikipedia, The Free Encyclopedia, Definition of "Silicon Nitride," Archived from Apr. 9, 2015, 1 page [Downloaded on Oct. 12, 2017 from https://web.archive.org/web/20150409055521/https://en.wikipedia.org/wiki/Silicon_nitride].
KR Office Action dated Jul. 15, 2025 in KR Application No. 10-2022-7045959 with English translation.
Cheng Y., et al., "Plasma Damage on Low-k Dielectric Materials," Chapter 15, Plasma Science and Technology, Intechopen, 2018, pp. 291-317.
CN Office Action dated Dec. 6, 2023, in CN Application No. 202080055912.2, with English translation.
CN Office Action dated Jan. 7, 2025 in CN Application No. 202080055912.2 with English translation.
CN Office Action dated Jun. 17, 2024 in CN Application No. 202110564747.X, with English Translation.
CN Office Action dated Sep. 11, 2024 in CN Application No. 202080055912.2 with English translation.
International Preliminary Report on Patentability and Written Opinion dated Dec. 5, 2024 in PCT Application No. PCT/US2023/023418.
International Preliminary Report on Patentability and Written Opinion dated Jan. 18, 2024 in PCT Application No. PCT/US2022/036026.
International Preliminary Report on Patentability and Written Opinion dated Jul. 4, 2024 in PCT Application No. PCT/US2022/081972.
International Preliminary Report on Patentability and Written Opinion dated Jul. 18, 2024 in PCT Application No. PCT/US2022/082624.
International Preliminary Report on Patentability and Written Opinion dated Jun. 13, 2024 in PCT Application No. PCT/US2022/080683.
International Preliminary Report on Patentability and Written Opinion dated Jun. 27, 2024 in PCT Application No. PCT/US2022/053014.
International Preliminary Report on Patentability and Written Opinion dated Mar. 7, 2024 in PCT Application No. PCT/US2022/075296.
International Preliminary Report on Patentability and Written Opinion dated Mar. 20, 2025 in PCT Application No. PCT/US2023/031873.
International Preliminary Report on Patentability and Written Opinion dated May 10, 2024 in PCT Application No. PCT/US2022/048098.
International Preliminary Report on Patentability and Written Opinion dated Oct. 3, 2024 in PCT Application No. PCT/US2023/064491.
International Preliminary Reporton Patentability and Written Opinion dated Feb. 2, 2023 in PCT Application No. PCT/US2021/042652.
International Search Report and Written Opinion dated Apr. 21, 2023, in PCT Application No. PCT/US2022/053014.
International Search Report and Written Opinion dated Dec. 26, 2023 in PCT Application No. PCT/US2023/031873.
International Search Report and Written Opinion dated Jul. 12, 2023 in PCT Application No. PCT/US2023/064491.
International Search Report and Written Opinion dated Mar. 2, 2023 in PCT Application No. PCT/US2022/048098.
International Search Report and Written Opinion dated May 8, 2023 in PCT Application No. PCT/US2022/082624.
International Search Report and Written Opinion dated Nov. 11, 2021, in PCT Application No. PCT/US2021/042652.
International Search Report and Written Opinion dated Oct. 28, 2022 in PCT Application No. PCT/US2022/036026.
International Search Report and Written Opinion dated Sep. 15, 2023 in PCT Application No. PCT/US2023/023418.
JP Office Action dated Feb. 4, 2025 in JP Application No. 2022-574509, with English Translation.
KR Decision to Grant and Search Report dated Mar. 27, 2025 in KR Application No. 10-2020-7010492, with English translation.
KR Notice of Allowances dated Oct. 17, 2024 in KR Application No. 10-2023-0184996 with English Translation.
KR Office Action dated Feb. 5, 2024 in KR Application No. 10-2023-0184996, with EnglishTranslation.
KR Office Action dated Sep. 27, 2024 in KR Application No. 10-2020-7010492 with English Translation.
SG Written Opinion dated Dec. 19, 2024 in SG Application No. 11202201069Y.
SG Written Opinion dated Jan. 17, 2024 in SG Application No. 11202201069Y.
TW Office Action and Search Report dated Apr. 2, 2025 in TW Application No. 110126961, with English Translation.
TW Office Action and Search Report dated Apr. 30, 2025 in TW Application No. 110127484, with English Translation.
TW Office Action and Search Report dated Dec. 31, 2024 in TW Application No. 110119959, with English Translation.
U.S. Corrected Notice of Allowance dated Jul. 17, 2024 in U.S. Appl. No. 17/632,074.
U.S. Final Office Action dated Mar. 29, 2024 in U.S. Appl. No. 17/632,074.
U.S. Non-Final Office Action dated Mar. 27, 2025 in U.S. Appl. No. 18/577,681.
U.S. Notice of Allowance dated Jul. 5, 2024 in U.S. Appl. No. 17/632,074.
U.S. Appl. No. 18/847,652, inventors Gupta A et al., filed on Sep. 16, 2024.
U.S. Appl. No. 18/868,708, inventors Gupta A et al., filed on Nov. 22, 2024.
U.S. Appl. No. 19/109,493, inventors Yang N et al., filed on Mar. 6, 2025.
U.S. Restriction Requirement dated Apr. 3, 2025 in U.S. Appl. No. 18/000,562.

* cited by examiner

IMPURITY REDUCTION IN SILICON-CONTAINING FILMS

INCORPORATION BY REFERENCE

A PCT Request Form is filed concurrently with this specification as part of the present application. Each application that the present application claims benefit of or priority to as identified in the concurrently filed PCT Request Form is incorporated by reference herein in their entireties and for all purposes.

BACKGROUND

Semiconductor device fabrication involves many different processes including, e.g., deposition and etching. One material that is commonly deposited is silicon oxide.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

One aspect involves a method for depositing a doped or undoped silicon-containing film on a substrate, the method including: (a) exposing the substrate to a first reactant, where the first reactant is a silicon-containing reactant; (b) reacting at least the first reactant in a first plasma to form a doped or undoped silicon-containing material, and depositing a portion of the doped or undoped silicon-containing film on the substrate, the doped or undoped silicon-containing film having a first impurity concentration; (c) before the depositing of the portion of the doped or undoped silicon-containing film is complete, performing an impurity reduction operation including: (i) generating a second plasma from a plasma generation gas, where the plasma generation gas includes inert gas and hydrogen ($H_2$), and where the plasma generation gas is substantially free of oxygen ($O_2$), and (ii) exposing the substrate to the second plasma to thereby reduce the first impurity concentration to a second impurity concentration in the doped or undoped silicon-containing material; and (d) repeating (a) with at least one of (b) or (c) until the doped or undoped silicon-containing film is deposited to a final thickness.

In various embodiments, the impurity is one or more of fluorine, carbon, hydrogen, nitrogen, and combinations thereof.

In various embodiments, the second reactant is an oxygen-containing reactant.

In some embodiments, the first reactant and second reactant are introduced to a chamber including the substrate simultaneously. In some embodiments, the first reactant and second reactant are introduced to a chamber including the substrate in temporally separated pulses.

In various embodiments, the method also includes (e) exposing the substrate to a second reactant, such that reacting at least the first reactant includes reacting the first reactant with the second reactant to form the doped or undoped silicon-containing material, such that repeating (a) with at least one of (b) or (c) further includes repeating (e).

In various embodiments, the doped or undoped silicon-containing film is deposited in recessed features formed in a surface of the substrate, the method further including exposing the substrate to etching chemistry to etch a top portion of the doped or undoped silicon-containing film in the recessed features before the doped or undoped silicon-containing film fully fills the recessed features.

In various embodiments, the doped or undoped silicon-containing film is deposited in recessed features formed in a surface of the substrate, the method further including exposing the substrate to inhibition chemistry to selectively inhibit deposition near a top of the recessed features as compared to a bottom and middle of the recessed features.

In some embodiments, the second impurity concentration is less than 10 times the first impurity concentration.

In some embodiments, concentration of fluorine in the doped or undoped silicon-containing film is on the order of about 1E16 atoms/cc once the doped or undoped silicon-containing film reaches the final thickness.

In some embodiments, concentration of carbon in the doped or undoped silicon-containing film is about 1E20 atoms/cc or less once the doped or undoped silicon-containing film reaches the final thickness.

In some embodiments, concentration of carbon in the doped or undoped silicon-containing film is about 5E19 atoms/cc or less once the doped or undoped silicon-containing film reaches the final thickness.

In some embodiments, concentration of carbon in the doped or undoped silicon-containing film is about 2% or less (atomic percent) once the doped or undoped silicon-containing film reaches the final thickness. For example, in some embodiments, the concentration of carbon in the doped or undoped silicon-containing film is about 0.5% or less (atomic percent) once the doped or undoped silicon-containing film reaches the final thickness.

In some embodiments, concentration of hydrogen in the doped or undoped silicon-containing film is about 5E20 atoms/cc or less once the doped or undoped silicon-containing film reaches the final thickness. For example, in some embodiments, the concentration of hydrogen in the doped or undoped silicon-containing film is about 1.5E20 atoms/cc or less once the doped or undoped silicon-containing film reaches the final thickness.

In some embodiments, concentration of hydrogen in the doped or undoped silicon-containing film is about 5% or less (atomic percent) once the doped or undoped silicon-containing film reaches the final thickness. For example, in some embodiments, the concentration of hydrogen in the doped or undoped silicon-containing film is about 0.75% or less (atomic percent) once the doped or undoped silicon-containing film reaches the final thickness.

In some embodiments, concentration of nitrogen in the doped or undoped silicon-containing film is about 3E20 atoms/cc or less once the doped or undoped silicon-containing film reaches the final thickness.

In some embodiments, concentration of nitrogen in the doped or undoped silicon-containing film is about 1.5% or less (atomic percent) once the doped or undoped silicon-containing film reaches the final thickness.

In some embodiments, generating the plasma in (d)(i) includes flowing the inert gas at a rate of about 2 slm to about 60 slm, flowing the hydrogen at a rate of about 0.5 slm to about 5 slm, and generating the plasma at an RF power level that includes about 1000 W to about 5000 W HF RF, and about 0 W to about 2000 W LF RF.

In some embodiments, the substrate is exposed to the plasma in (d)(ii) for a duration of about 1 second or less.

In some embodiments, the inert gas in the plasma generation gas includes argon.

In some embodiments, the plasma generation gas includes nitrogen ($N_2$).

In some embodiments, the first reactant includes a silane. In some embodiments, the first reactant includes aminosilane.

Another aspect involves an apparatus for depositing a doped or undoped silicon-containing film on a substrate, the apparatus including: a processing chamber; an inlet to the processing chamber for introducing reactants to the processing chamber; a plasma generator for generating a plasma in the processing chamber; and a controller configured to cause any of the methods described herein.

These and other aspects are described further below with reference to the drawings.

DETAILED DESCRIPTION

Figure 1A:
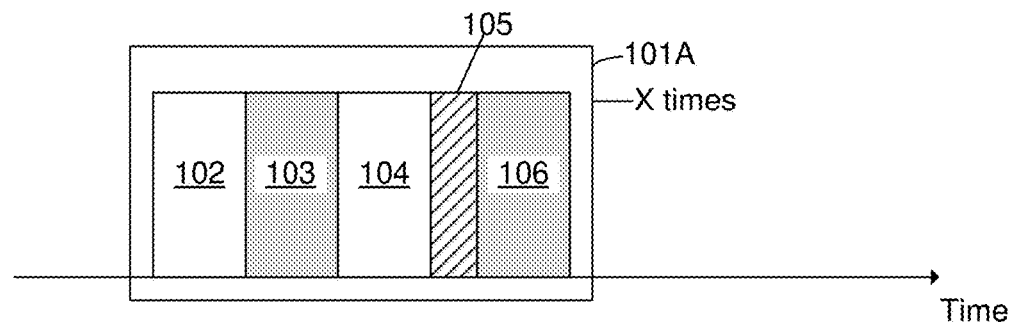
FIG. 1A illustrates a process flow where silicon oxide film is deposited through atomic layer deposition, where impurity reduction is included as part of the atomic layer deposition cycle.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Silicon-containing materials are commonly deposited during fabrication of semiconductor devices. Example silicon-containing materials include silicon oxide, silicon oxynitride, silicon nitride, silicon carbonitride, silicon oxycarbide, silicon carbohydride. Silicon-containing materials may be doped or undoped. Doped materials include dopants such as boron and/or phosphorous. A number of different deposition processes are available. In many cases, vapor-based deposition processes are used. Example vapor-based deposition processes include, e.g., atomic layer deposition (ALD), plasma enhanced atomic layer deposition (PEALD), chemical vapor deposition (CVD), plasma enhanced chemical vapor deposition (PECVD), remote plasma chemical vapor deposition (RPCVD), remote plasma atomic layer deposition (RPALD), inductively coupled plasma chemical vapor deposition (ICP-CVD) or high density plasma chemical vapor deposition (HDP-CVD), and others. In some cases, more complex deposition schemes may be used, which may include cycling deposition operations with other operations such as etching, inhibition, and/or passivation.

Unfortunately, many of these deposition processes result in substantial incorporation of impurities into the silicon-containing film. These impurities can include, e.g., fluorine, carbon, hydrogen, and nitrogen. These elements may negatively affect various physical and electrical properties of the devices being formed. For instance, such impurities in silicon oxide can cause a relatively higher wet etch rate, which correlates with a lower quality silicon oxide film. Further, the presence of these impurities can negatively affect the leakage current and breakdown voltage in the devices, making such films unsuitable for electrical isolation purposes.

The carbon, hydrogen, and nitrogen may be introduced into the silicon-containing film as a result of the precursors that are used for depositing the silicon-containing film. For instance, aminosilane-based precursors are commonly used in vapor deposition techniques. These aminosilane-based precursors include carbon, hydrogen, and nitrogen in addition to the desired silicon. Under typical deposition conditions for depositing silicon oxide, a substantial amount of this carbon, hydrogen, and nitrogen is undesirably incorporated into the silicon oxide film during deposition.

Various operations can be taken to reduce the carbon, hydrogen, and nitrogen impurities. For example, the deposition conditions can be controlled to minimize incorporation of the impurities. In one particular example, the concentration of impurities in a silicon oxide film can be reduced by depositing at relatively high temperatures (e.g., about 900° C. or greater). However, high deposition temperatures can be overly limiting in some cases.

In another example, a halogen-based silicon-containing precursor may be used in place of an aminosilane-based precursor. Example halogen-based silicon-containing precursors include, but are not limited to, silicon tetrachloride ($SiCl_4$), dichlorosilane ($SiH_2CO_2$), diiodosilane ($SiH_2I_2$), etc. Many such halogen-based silicon-containing precursors contain little or no carbon, nitrogen, and/or hydrogen, particularly as compared to common aminosilane-based precursors such as tris(dimethylamino)silane (also referred to as 3DMAS, having the formula $C_6H_{19}N_3Si$). For example, although dichlorosilane and diiodosilane each include two hydrogens, the ratio of Si:H is relatively high at 1:2. By contrast, in tris(dimethylamino)silane, the ratio of Si:H is much lower at 1:19. Because the halogen-based silicon-containing precursors include relatively less carbon, nitrogen, and hydrogen than the aminosilane-based precursors, there is less incorporation of these elements into the silicon oxide film during deposition. However, halogen species are known to attack metals in the processing chamber where deposition takes place, and the metal that is etched from the processing chamber can be deposited on substrates being processed. As such, the halogen-based precursor methods are difficult to implement and can cause degradation of processing equipment and poor defect performance on substrates.

The fluorine impurities in a silicon-containing film may originate from a number of different sources. In many cases, fluorine-containing chemistry is periodically used to clean the processing chamber in which deposition takes place. This cleaning may target removal of film buildup on interior chamber surfaces. Residual fluorine may be left on the chamber surfaces after a cleaning operation, and can end up in the silicon oxide film deposited in the chamber. Because the fluorine is introduced via the chamber cleaning operation, it is understood that this cleaning can lead to incorporation of fluorine in a silicon oxide film regardless of the deposition scheme used to form the silicon oxide film. Further, in these or other cases, a silicon-containing film may be deposited using a particular deposition scheme that involves exposing the substrate to $NF_3$ or other fluorine-containing chemistry. This fluorine-containing chemistry is especially useful in the context of gapfill, where silicon oxide is deposited in recessed features that may have a high depth:width aspect ratio. These features can be very difficult to fill in a uniform manner without the formation of voids or seams within the features. In one example, a deposition-etch-deposition scheme ("dep-etch-dep") is used, where deposition, etching, and/or passivation operations are cycled with one another as the feature is filled with a silicon-containing material. The etching ensures that the feature remains sufficiently open to allow further silicon-containing material deposition without closing off the features and forming voids. However, the etching operation(s) typically involve exposing the substrate to $NF_3$ or other fluorine-containing chemistry, which results in the incorporation of fluorine into the silicon-containing film.

In another example, an inhibition-based deposition scheme is used, where inhibition, deposition, and/or passivation operations are cycled with one another as the feature is filled with a silicon-containing material. This deposition scheme may be referred to as inhibitor-controlled exposure (ICE) deposition. The inhibition involves exposing the substrate to $NF_3$ or similar chemistry to selectively inhibit deposition at or near the top of the feature, thus promoting a bottom-up fill mechanism that fills the feature without the formation of voids or seams. While both the deposition-etch-deposition scheme and the inhibition-based deposition scheme involve periodic exposure to $NF_3$ or similar chemistry, it is understood that the $NF_3$ may have different effects (e.g., etching vs. inhibition) depending on the other processing conditions that are used.

In either case, exposure of the substrate to $NF_3$ or other fluorine-containing chemistry results in the incorporation of fluorine impurities in the silicon-containing film. In order to reduce the fluorine impurities, a passivation operation without impurity reduction may be used, as mentioned above, which involves exposing the substrate to plasma generated from argon, hydrogen ($H_2$), and oxygen ($O_2$). The plasma typically has a relatively high concentration of oxygen. In one example, the flow rate for a 4-station chamber of $H_2$ is about 2 slm, the flow rate for a 4-station chamber of $O_2$ is about 2 slm, and the flow rate for a 4-station chamber of Ar is about 10 slm. The plasma is typically generated at an RF power about 1250 W to about 2500 W (e.g., for a chamber having four stations each for processing a 300 mm substrate), and a substrate is exposed to the plasma for a duration about 5 to about 10 seconds during each iteration. The pressure in a reaction chamber for a 4-station chamber may be about 1 Torr to about 10 Torr, or about 2 Torr. When this passivation operation without impurity reduction is used during deposition, the fluorine content in the film is lower than it would be without the passivation operation. For instance, in various cases where the silicon-containing material is deposited through the deposition-etch-deposition mechanism or the inhibition-based deposition mechanism, the passivation operation may lower the fluorine content in the film by about one or two orders of magnitude. As an example, typical fluorine concentrations for such films are about 1E18 to about 1E21 atoms/cc, or about 1E18 to about 1E20 atoms/cc, with the highest fluorine concentrations often being found at interfaces/film depths where the deposition operations were stopped and etching or inhibition operations were used. Experimental results are described further below.

The reduction in fluorine content achieved with the passivation operation without impurity reduction is beneficial. However, even with passivation, the fluorine concentration is higher than desired for many applications, and it would be advantageous to further reduce the fluorine content of the silicon-containing film.

Provided herein are methods and apparatuses for incorporating an impurity reduction operation, sometimes referred to as a passivation operation, which can be used to substantially reduce the fluorine content in the film. Certain disclosed embodiments use processing conditions different from that of a passivation operation without impurity reduction such as described above. For instance, an impurity reduction operation as described herein can further reduce the fluorine content in the film by an additional one to two orders of magnitude compared to the passivation operation without impurity reduction. In various cases, deposition using the impurity reduction operation may produce a silicon oxide film having a fluorine content on the order of about 1E16 atoms/cc.

The impurity reduction operation may be practiced in the context of depositing a silicon-containing material in recessed features (e.g., low aspect ratio features such as those having a depth:width aspect ratio as low as about 1:1, high aspect ratio features such as those having a depth:width ratio as high as about 100:1, and recessed features having aspect ratios of about the range of these values). The impurity reduction operation may also be practiced in the context of depositing a blanket film of a silicon-containing material, such as silicon oxide. Example applications include $SiO_2$ (in some cases $SiO_2$/SiN) deposition in NAND, DRAM, logic, PCRAM, and MRAM applications, etc.

Advantageously, the impurity reduction operation also has the effect of reducing the carbon content, hydrogen content, and nitrogen content in silicon-containing films. As such, the impurity reduction operation produces silicon-containing films that are substantially purer than was previously achievable using aminosilane-based precursors and/or the deposition techniques described above.

Further, the impurity reduction operation can be performed in substantially less time than is required for the passivation operation without impurity reduction. In other words, the impurity reduction operation achieves better results (e.g., greater reduction in impurities) in less time. As a result, individual cycle times and overall deposition times are significantly reduced, leading to increased throughput on certain deposition apparatuses. This is a substantial improvement.

Deposition Methods

Certain disclosed embodiments may involve ALD. ALD is a technique that deposits thin layers of material using sequential self-limiting reactions. ALD processes use surface-mediated deposition reactions to deposit films on a layer-by-layer basis in cycles. As an example, an ALD cycle may include the following operations: (i) delivery/adsorption of a precursor, (ii) purging of precursor from the chamber, (iii) delivery of a second reactant and optionally ignite plasma, and (iv) purging of byproducts from the chamber. The reaction between the second reactant and the adsorbed precursor to form a film on the surface of a substrate affects the film composition and properties, such as nonuniformity, stress, wet etch rate, dry etch rate, electrical properties (e.g., breakdown voltage and leakage current), etc.

Unlike a chemical vapor deposition (CVD) technique, ALD processes use surface-mediated deposition reactions to deposit films on a layer-by-layer basis. In one example of an ALD process, a substrate surface that includes a population of surface active sites is exposed to a gas phase distribution of a first precursor, such as a silicon-containing precursor, in a dose provided to a chamber housing a substrate. Molecules of this first precursor are adsorbed onto the substrate surface, including chemisorbed species and/or physisorbed molecules of the first precursor. It should be understood that when a compound is adsorbed onto the substrate surface as described herein, the adsorbed layer may include the compound as well as derivatives of the compound. For example, an adsorbed layer of a silicon-containing precursor may include the silicon-containing precursor as well as derivatives of the silicon-containing precursor. After a first precursor dose, the chamber is then evacuated to remove most or all of first precursor remaining in gas phase so that mostly or only the adsorbed species remain. In some implementations, the chamber may not be fully evacuated. For example, the reactor may be evacuated such that the partial pressure of the first precursor in gas phase is sufficiently low to mitigate a reaction. A second reactant, such as an oxygen-containing gas, is introduced to the chamber so that some of these molecules react with the first precursor adsorbed on the surface. In some processes, the second precursor reacts immediately with the adsorbed first precursor. In other embodiments, the second reactant reacts only after a source of activation is applied temporally. The chamber may then be evacuated again to remove unbound second reactant molecules. As described above, in some embodiments the chamber may not be completely evacuated. Additional ALD cycles may be used to build film thickness.

In some implementations, the ALD methods include plasma activation. As described herein, the ALD methods and apparatuses described herein may be conformal film deposition (CFD) methods, which are described generally in U.S. patent application Ser. No. 13/084,399 (now U.S. Pat. No. 8,728,956), filed Apr. 11, 2011, and titled "PLASMA ACTIVATED CONFORMAL FILM DEPOSITION," and in U.S. patent application Ser. No. 13/084,305, filed Apr. 11, 2011, and titled "SILICON NITRIDE FILMS AND METHODS," which are herein incorporated by reference in their entireties.

FIGS. 1A-1E illustrate a number of deposition schemes that may be used in various embodiments. Each example deposition scheme can be performed alone or in combination with any one or more of the other deposition schemes depicted in FIGS. 1A-1E. FIG. 1A depicts an ALD cycle 101A that is modified to include the impurity reduction operation. The x-axis represents time. In this example, the ALD cycle 101A includes a dose operation 102, followed by an optional purge operation 103, followed by an oxidation operation 104, followed by an impurity reduction operation 105, followed by a second optional purge operation 106. In ALD without impurity reduction, the impurity reduction operation 105 is omitted.

When practicing the embodiment of FIG. 1A, a first reactant (e.g., a silicon-containing precursor, such as an aminosilane-based precursor) is provided to the reaction chamber during the dose operation 102. The first reactant is allowed to adsorb onto a surface of the substrate. Excess first reactant may be removed from the reaction chamber during the purge operation 103. This can be done by purging and/or evacuating the process chamber to remove excess first reactant, without removing the adsorbed layer. Purging can be done using any inert gas such as nitrogen ($N_2$), argon (Ar), neon (Ne), helium (He), hydrogen ($H_2$), and their combinations.

A second reactant (e.g., an oxygen-containing reactant) is provided to the substrate during the oxidation operation 104, and the first and second reactants react with one another on the surface of the substrate to form a silicon-containing material. In some cases, thermal energy is used to drive the reaction between the first and second reactants. In other cases, plasma energy may be used to drive this reaction.

The substrate is exposed to an impurity reduction plasma during the impurity reduction operation 105, as discussed further below. Excess reactants and byproducts are removed from the reaction chamber during the second purge operation 106. Second purge operation 106 may involve any of the process conditions described above with respect to purge operation 103. The purge operation 103 and second purge operation 106 may involve evacuating and/or sweeping the reaction chamber with inert gas. The ALD cycle 101A of FIG. 1A may be repeated any number of times (e.g., X times in FIG. 1A) to achieve a desired film thickness.

In a similar embodiment, the impurity reduction operation 105 may occur at a different time during the ALD cycle 101A of FIG. 1A. In general, the impurity reduction operation 105 may occur before, during, or after the purge operation 106, before a subsequent iteration of the dose operation 102.

Figure 1B:
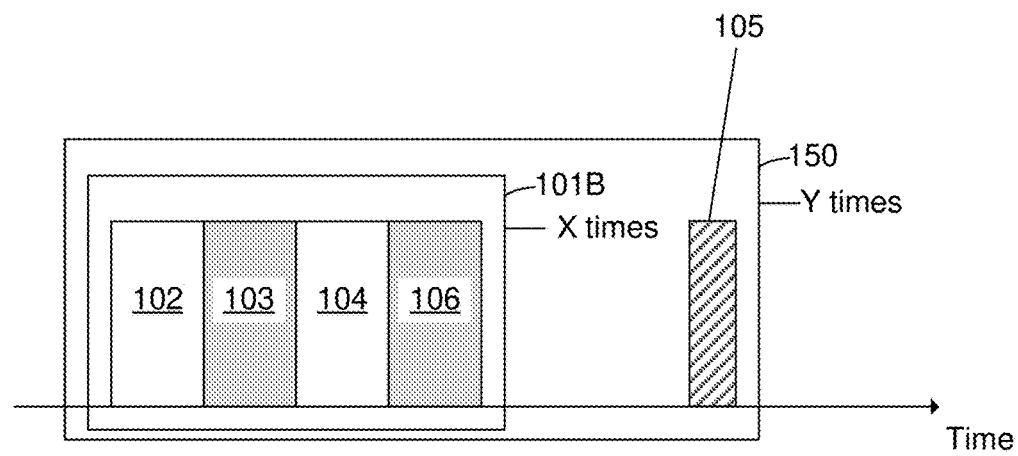
FIG. 1B illustrates a process flow where silicon oxide film is deposited through atomic layer deposition, where impurity reduction is periodically performed after a number of atomic layer deposition cycles.

FIG. 1B illustrates another example where deposition occurs through ALD. In this example, the ALD cycle 101B includes the dose operation 102, purge operation 103, oxidation operation 104, and second purge operation 106. These operations are analogous to those described above, and they may be repeated any number of times (e.g., X times in FIG. 1B) to build up additional film thickness. After the ALD cycle 1011B is repeated X times, the impurity reduction operation 105 is performed. The ALD cycle 101B and the impurity reduction operation 105 (see reference numeral 150) may together be repeated any number of times (e.g., Y times in FIG. 1B). Performing the impurity reduction operation 105 more frequently may result in greater impurity reduction, but it also results in increased processing times and decreased throughput. In various embodiments where deposition occurs according to FIG. 1B, X may be about 1 to about 20, and Y may be about 1 to about 100. Y may be selected to achieve a desired final film thickness. In a particular embodiment of the method in FIG. 1B, the deposition rate is on the order of about 1 Å/cycle, X=20, and Y=100, producing a film that has a total thickness of approximately 2000 Å.

In these or other embodiments, the impurity reduction operation 105 may occur periodically, with the frequency based on the thickness of film deposited in each cycle. In one example, the impurity reduction operation 105 may be repeated after each 1 nm of silicon-containing film is deposited (e.g., deposit 1 nm of silicon-containing film, perform impurity reduction 105, repeat). More generally, the impurity reduction operation 105 may be repeated after each 0.1-2 nm portion/thickness of silicon-containing film is deposited. Where the silicon-containing film is deposited as a blanket film, the thickness of the blanket film may be used. Where the silicon-containing film is deposited in a recessed feature, the thickness of film may be measured from the bottom of the feature upwards.

Figure 1C:
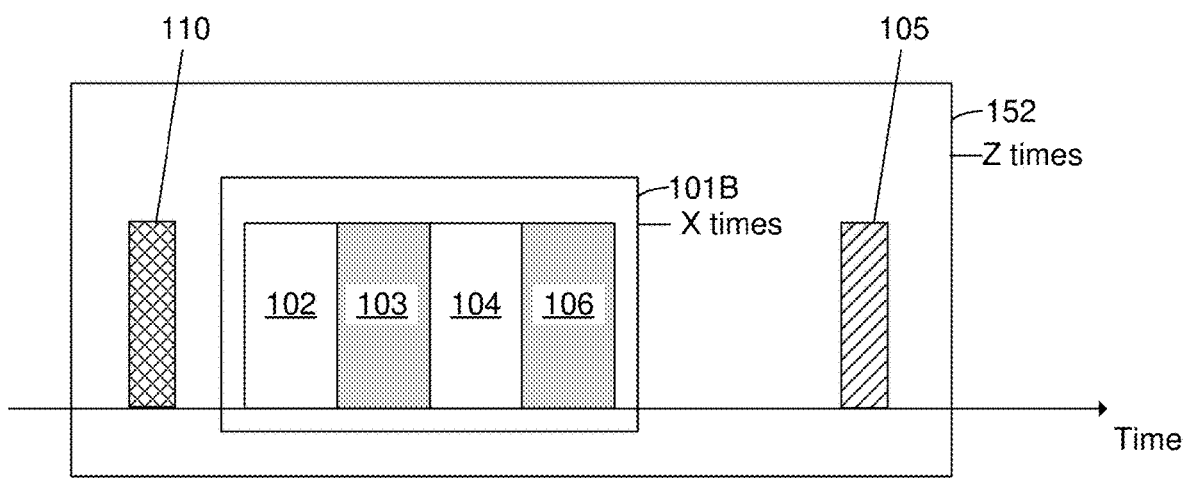
FIG. 1C depicts a process flow where silicon oxide film is deposited through an inhibition-based deposition scheme, where impurity reduction is periodically performed over the course of depositing the silicon oxide film.

FIG. 1C depicts an example where deposition occurs through an inhibition-based mechanism (e.g., ICE), for example in the context of gapfill. The process starts with inhibition operation 110, where the substrate is exposed to $NF_3$ or similar chemistry to selectively inhibit deposition near the top of recessed features on the substrate surface, as compared to the bottom and middle of the recessed features. Next, ALD cycle 101B is performed, including dose operation 102, purge operation 103, oxidation operation 104, and purge operation 106. ALD cycle 101B may be repeated any number of times (e.g., X times in FIG. 1C). Next, the impurity reduction operation 105 is performed, as described further below. The impurity reduction operation 105 may be performed in place of a passivation operation without impurity reduction. In the example of FIG. 1C, the impurity reduction operation 105 also acts to completely remove any remaining inhibitor species present on the substrate, which originated from the inhibition operation 110. The inhibitor species are slowly eroded away during the ALD cycles 101B; however, some inhibitor species typically remain. By completely stripping away any remaining inhibitor species, the impurity reduction operation 105 restores the sidewalls of the feature (e.g., particularly the upper sidewalls where the inhibition species were present) back to their original uninhibited state. This ensures that a subsequent inhibition operation 110 can be performed in a uniform, reproducible manner, targeting the upper sidewalls for inhibition.

The inhibition operation 110, ALD cycle 101B, and impurity reduction operation 105 (see reference numeral 152) may be repeated together any number of times (e.g., Z times in FIG. 1C). As with the mechanism of FIG. 1B, increasing the frequency of the impurity reduction operation 105 may result in greater impurity reduction at the expense of longer processing times and lower throughput. In various embodiments where the deposition occurs according to the method shown in FIG. 1C, X may be about 1 to about 10, and Z may be about 1 to about 100. In these or other embodiments, the impurity reduction operation 105 may occur periodically, with the frequency based on the thickness of film deposited in each cycle. In one example, the impurity reduction operation 105 may be repeated after each 1 nm of silicon-containing film is deposited (e.g., deposit 1 nm of silicon-containing film, perform impurity reduction 105, repeat). More generally, the impurity reduction operation 105 may be repeated after each about 0.1 nm to about 20 nm or about 0.1 nm to about 10 nm portion/thickness of silicon-containing film is deposited. Where the silicon-containing material is deposited in recessed features, the thickness of the silicon-containing film may be measured from the bottom of the feature upwards.

Figure 1D:
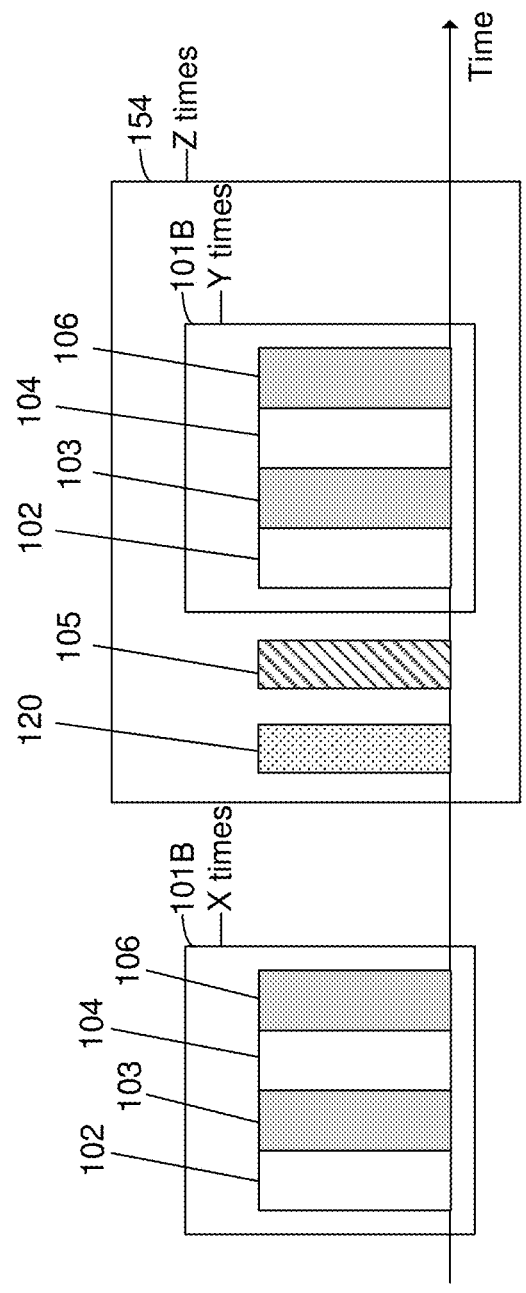
FIG. 1D illustrates a process flow where silicon oxide film is deposited through a deposition-etch-deposition scheme, where impurity reduction is periodically performed over the course of depositing the silicon oxide film.

FIG. 1D illustrates an example where deposition occurs through a deposition-etch-deposition mechanism, for example in the context of gapfill. The process starts with ALD cycle 101B, which may be performed X times. Next, an etch operation 120 is performed to partially etch the silicon-containing material previously deposited in the recessed features to thereby ensure that the features do not become closed/clogged over the course of the deposition. The etch operation 120 may involve exposing the substrate to $NF_3$ or other etching chemistry (e.g., often fluorine-containing chemistry), which may be provided in plasma form in various embodiments. The ALD cycle 101B and the etch operation 120 (see reference numeral 153) may together be repeated any number of times (e.g., Y times in FIG. 1D). Next, an impurity reduction operation 105 is performed, as described further below. The ALD cycle 101B, etch operation 120, and impurity reduction operation 105 (see reference numeral 154) may together be repeated any number of times (e.g., Z times in FIG. 1D). In various embodiments where deposition occurs according to the method shown in FIG. 1D, X may be about 1 to about 1000, Y may be about 1 to about 1000, and Z may be about 2 to about 5. X may be the same or different from Y. In many cases, X is greater than Y such that a majority (e.g., at least about 50%, at least about 75%, or at least about 90%) of the silicon-containing film is deposited before the etch operation 120 and the impurity reduction operation 105 take place. In various cases, X may be determined based on the size of the feature being filled.

In these or other embodiments, the impurity reduction operation 105 may occur periodically, with the frequency based on the thickness of film deposited in each cycle. Generally, the impurity reduction operation 105 may be repeated after each about 0.1 nm to about 20 nm or about 0.1 nm to about 10 nm portion/thickness of silicon-containing film is deposited. Where the silicon-containing film is deposited in a recessed feature, the thickness of the film may be measured from the bottom of the feature upwards.

Figure 1E:
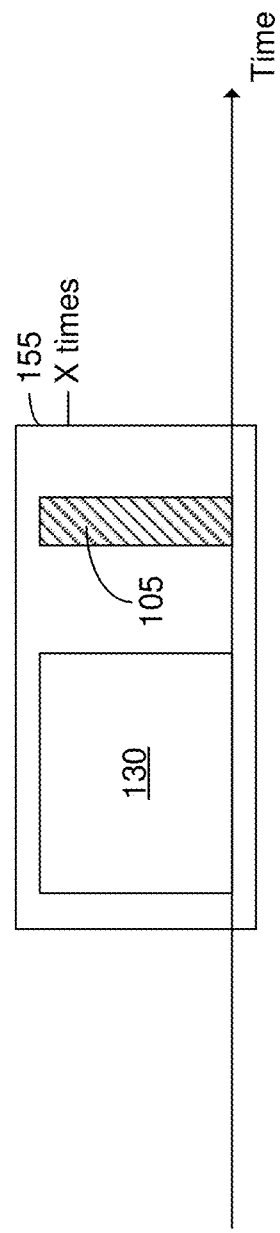
FIG. 1E depicts a process flow where silicon oxide film is deposited through chemical vapor deposition, where impurity reduction is periodically performed over the course of depositing the silicon oxide film.

FIG. 1E illustrates an example where deposition occurs through chemical vapor deposition. The method begins with reactant delivery operation 130, where a silicon-containing reactant and an oxygen-containing reactant are simultaneously delivered to the reaction chamber, where they react with one another and deposit silicon-containing material on the surface of the substrate. The reaction may be driven by thermal energy or plasma energy. Next, the impurity reduction operation 105 is performed, as discussed further below. The reactant delivery operation 130 and the impurity reduction operation 105 (see reference numeral 155) may be repeated any number of times (e.g., X times in FIG. 1E). In various embodiments where the deposition occurs according to the method shown in FIG. 1E, X may be about 1 to about 1000, for example about 1 to about 100 or about 1 to about 10. In these or other embodiments, the impurity reduction operation 105 may occur periodically, with the frequency based on the thickness of film deposited in each cycle. In one example, the impurity reduction operation 105 may be repeated after each 10 nm of silicon-containing film is deposited (e.g., deposit 10 nm of silicon-containing film, perform impurity reduction 105, repeat). More generally, the impurity reduction operation 105 may be repeated after each about 0.1 nm to about 20 nm or about 0.1 nm to about 10 nm portion/thickness of silicon-containing film is deposited.

While ALD and CVD embodiments are described above, it will be understood that certain disclosed embodiments may be implemented with any deposition process that involves plasma. Non-limiting examples include RPCVD, RPALD, ICP-CVD, and HDP-CVD. In various embodiments, only a single reactant may be used to form a film in a plasma-based environment and an impurity reduction operation can still be used to reduce impurities in the film.

Process Conditions for Impurity Reduction Operation

In various embodiments, the impurity reduction operation involves exposing the substrate to plasma generated from a plasma generation gas that includes inert gas and hydrogen (e.g., $H_2$). The plasma generation gas is substantially free of oxygen (e.g., $O_2$ and other oxygen-containing species). As used herein, a plasma generation gas that is "substantially free" of oxygen may have trace amounts of oxygen; however, oxygen and oxygen-containing species are not intentionally provided as part of the plasma generation gas. In various embodiments, the inert gas includes argon. Alternatively or in addition, other noble gases (e.g., helium, neon, krypton, etc.) may be used in some cases. In some cases, the plasma generation gas may further include nitrogen (e.g., $N_2$). Example flow rates for a 4-station chamber for the inert gas may be about 2 to about 60 slm. In some cases, the flow rate for the inert gas may be at least about 2 slm, at least about 5 slm, at least about 10 slm, at least about 20 slm, at least about 30 slm, or at least about 40 slm. In these or other cases, the flow rate of inert gas may be about 60 slm or less, about 50 slm or less, about 40 slm or less, about 30 slm or less, or about 20 slm or less. Example flow rates for the hydrogen (e.g., $H_2$) may be about 0.5 and about 5 slm. In some cases, the flow rate of hydrogen may be at least about 0.5 sim, at least about 0.1 slm, at least about 0.5 sim, at least about 1 slm, at least about 2 slm, or at least about 3 sim. In these or other cases, the flow rate of hydrogen may be about 5 slm or less, about 4.5 slm or less, about 4 slm or less, or about 3.5 slm or less. Where it is used, example flow rates for nitrogen (e.g., $N_2$) may be up to about 30 slm, in some cases up to about 20 sim, or up to about 10 slm.

The plasma may be generated at an RF power that includes about 1000 and about 6000 or about 1000 and about 5000 W (HF RF for a 13.56 MHz capacitively coupled plasma), and about 0 W and about 5000 W or 0 W and about 3000 W or about 0 W and about 2000 W (LF RF for a 400 kHz (or 50 kHz to 2 MHz) plasma) for a chamber having 4 stations. In other words, the RF power may be provided at single frequency (HF only) or dual frequency (e.g., HF and LF). In some cases, the HF RF for a 13.56 MHz capacitively coupled plasma may be provided at a power level of at least about 1000 W, or at least about 2000 W, or at least about 3000 W for a chamber having 4 stations. In these or other cases, the HF RF for a 13.56 MHz capacitively coupled plasma may be provided at a power level of about 6000 W or less, about 5000 W or less, in some cases about 4000 W or less, or about 3000 W or less for a chamber having 4 stations. In these or other cases, the LF RF may be omitted. In other embodiments, the LF RF for a 400 kHz (or 50 kHz to 2 MHz) plasma may be provided at a power level of at least about 1 W, at least about 10 W, at least about 50 W, at least about 100 W, at least about 500 W, or at least about 1000 W for a chamber having 4 stations. In these or other cases, the LF RF for a 400 kHz (or 50 kHz to 2 MHz) plasma may be provided at a power level of about 5000 W or less, or about 3000 W or less, or about 2000 W or less, for example 1500 W or less, or 1000 W or less, or 500 W or less, or 200 W or less for a chamber having 4 stations. These power levels are appropriate for a substrate having a diameter of about 300 mm, and may be scaled accordingly for substrates of different sizes. Example frequencies include, e.g., 13.56 MHz, 27 MHz, and 60 MHz, though these are not intended to be limiting. During the plasma exposure operations, the plasma may have a duty cycle about 10% and about 100%. The plasma may be any type of plasma. In some cases, the plasma is a capacitively coupled plasma. In other cases, the plasma is an inductively coupled plasma or a microwave plasma. In some embodiments, the plasma is a remote plasma. In some embodiments, the plasma is generated by electron cyclotron resonance (ECR).

During the impurity reduction operation, the pressure in the reaction chamber may be maintained about 0.5 to about 20 Torr. In various embodiments, the pressure may be at least about 0.5 Torr, at least about 1 Torr, at least about 5 Torr, or at least about 10 Torr. In these or other cases, the pressure may be about 20 Torr or less, or about 15 Torr or less, or about 10 Torr or less. The substrate may be positioned on a substrate support, which may be temperature controlled. In some cases, the substrate may be heated or cooled during the impurity reduction operation, for example through the substrate support. Example substrate support temperatures may be about −400° C. to about 1400° C. or about −40° C. to about 1000° C. or about 150° C. to about 650° C. In some cases, the substrate support is maintained at a temperature of at least about 150° C., or at least about 200° C., or at least about 300° C., or at least about 400° C. In these or other cases, the substrate support may be maintained at a temperature of about 650° C. or less, or about 600° C. or less, or about 500° C. or less, or about 400° C. or less, or about 300° C. or less, or about 200° C. or less.

During the impurity reduction operation, the substrate may be exposed to the plasma for a duration about 0.2 and about 120 seconds. In various embodiments, the plasma exposure duration may be at least about 0.2 seconds, or at least about 0.5 seconds, or at least about 0.1 second, or at least about 0.2 seconds. In these or other embodiments, the plasma exposure duration may be about 120 seconds or less, or about 10 seconds or less, or about 1 second or less, or about 0.5 seconds or less. In many cases, the desired impurity reduction is achieved very quickly, typically in less than 1 second. This is a substantial improvement (e.g., reduced processing time) over the existing passivation methods described above, which require at least 5-10 seconds of exposure time.

In many cases, the impurity reduction operation may be performed at significantly higher flow rates for hydrogen and inert gas, as compared to a passivation operation without impurity reduction. Another difference between the impurity reduction operation and the passivation operation without impurity reduction is the omission of oxygen in the plasma generation gas. In the passivation operation without impurity reduction, oxygen is provided at a substantial flow rate. By contrast, in the impurity reduction operation, oxygen is omitted from the plasma generation gas. Further, the impurity reduction operation typically occurs at higher RF power levels than passivation operation without impurity reduction. As a result of such differences, the impurity reduction operation is substantially more effective in removing fluorine from the silicon-containing film (e.g., about one to two orders of magnitude more effective, in less time), as compared to the passivation operation without impurity reduction, as discussed further below in the Experimental section. Advantageously, the impurity reduction operation also lowers the concentration of carbon, hydrogen, and nitrogen in the film.

Another advantage of the disclosed impurity reduction operation is that it can be performed in situ. In other words, it can be performed in the same reaction chamber in which the silicon-containing film is being deposited. While it is possible for the impurity reduction operation to take place in another chamber separate from the deposition chamber (e.g., with the substrate being transferred between chambers as needed), there is no need to provide a separate chamber for this purpose. Appropriate apparatus are discussed further below in the Apparatus section.

Process Conditions for Deposition Operations

As explained in relation to FIGS. 1A-1E, the impurity reduction operation described herein may be practiced in many different contexts using various reaction mechanisms. As such, the embodiments herein are not intended to be limited to a particular set of deposition conditions. However, certain example conditions are provided as guidance.

In various embodiments where the deposition occurs through a method that involves atomic layer deposition cycles (e.g., as described in relation to FIGS. 1A-1D), one or more of the following reaction conditions may be used. During the dose operation, a silicon-containing reactant may be provided to the reaction chamber at a flow rate of about 150 sccm to about 900 sccm. The silicon-containing reactant is allowed to adsorb onto the surface of the substrate. The silicon-containing reactant may be a silane, and in many cases is an aminosilane. Example aminosilanes include, but are not limited to, tris(dimethylamino)silane, bis(tert-butylamino)silane, 1,1,1,3,3,3-hexamethyldisilazane, cyclic azasilanes, tetrakis(dimethylamino)silane, trisilylamine, bis(diethylamino)silane, etc. An aminosilane includes at least one nitrogen atom bonded to a silicon atom, but may also contain hydrogens, oxygens, halogens and carbons. Examples of aminosilanes are mono-, di-, tri- and tetra-aminosilane ($H_3Si(NH_2)_4$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tertiarybutylamino)silane ($SiH_2(NHC(CH_3)_3)_2$ (BTBAS), tert-butyl silylcarbamate, $SiH(CH_3)$—$(N(CH_3)_2)_2$, $SiHCl$—$(N(CH_3)_2)_2$, $(Si(CH_3)_2NH)_3$, di(sec-butylamino)silane (DS-BAS), di(isopropylamido)silane (DIPAS), bis(diethylamino)silane (BDEAS), and the like. A further example of an aminosilane is trisilylamine ($N(SiH_3)_3$). Various other silanes may be used, as well.

Example silicon-containing reactants include, but are not limited to, silanes, polysilanes, halosilanes, and aminosilanes. A silane contains hydrogen and/or carbon groups, but does not contain a halogen. A polysilane may have the formula ($H_3Si$—$(SiH_2)_n$—$SiH_3$), where n≥1. Examples of silanes include silane ($SiH_4$), disilane ($Si_2H_6$), trisilane, tetrasilane and organo silanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, tetra-ethyl-ortho-silicate (also known as tetra-ethoxy-silane or TEOS) and the like.

Example silicon-containing reactants include polysilanes ($H_3Si$—$(SiH_2)_n$—$SiH_3$), where n≥1, such as silane, disilane, trisilane, tetrasilane; and trisilylamine:

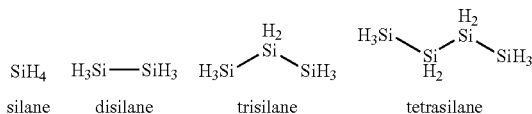

silane    disilane    trisilane    tetrasilane

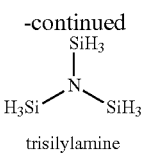

trisilylamine

In some embodiments, the silicon-containing reactant is an alkoxysilane. Alkoxysilanes that may be used include, but are not limited to, the following:

$H_x$—$Si$—$(OR)_y$, where x=1-3, x+y=4 and R is a substituted or unsubstituted alkyl group; and $H_x(RO)_y$—$Si$—$Si$—$(OR)_yH_x$ where x=1-2, x+y=3 and R is a substituted or unsubstituted alkyl group.

Examples of silicon-containing reactants include: methylsilane; trimethylsilane (3MS); ethylsilane; butasilanes; pentasilanes; octasilanes; heptasilane; hexasilane; cyclobutasilane; cycloheptasilane; cyclohexasilane; cyclooctasilane; cyclopentasilane; 1,4-dioxa-2,3,5,6-tetrasilacyclohexane; diethoxymethylsilane (DEMS); diethoxysilane (DES); dimethoxymethylsilane; dimethoxysilane (DMOS); methyldiethoxysilane (MDES); methyl-dimethoxysilane (MDMS); octamethoxydodecasiloxane (OMODDS); tert-butoxydisilane; tetramethylcyclotetrasiloxane (TMCTS); tetraoxymethylcyclotetrasiloxane (TOMCTS); triethoxysilane (TES); triethoxysiloxane (TRIES); and trimethoxysilane (TMS or TriMOS).

In some embodiments, the silicon-containing precursor may be an aminosilane, with hydrogen atoms, such as bisdiethylaminosilane, diisopropylaminosilane, tert-butylamino silane (BTBAS), or tris(dimethylamino)silane (3DMAS). Aminosilane precursors include, but are not limited to, the following: $H_x$—$Si$—$(NR)_y$ where x=1-3, x+y=4 and R is an organic or hydride group.

In some embodiments, a halogen-containing silane or halosilane may be used such that the silane includes at least one hydrogen atom. A halosilane may have a formula $SiX_aH_y$ whereby X=Cl, F, I, or Br, and a+y=4, where a≥1. A halosilane may have a formula $SiX_aH_y(CH_3)_z$ where X=Cl, F, I, or Br, and a+y+z=4, where a≥1. Examples of halosilanes are iodosilanes, bromosilanes, chlorosilanes and fluorosilanes. Although halosilanes, particularly fluorosilanes, may form reactive halide species that can etch silicon materials, in certain embodiments described herein, the silicon-containing precursor is not present when a plasma is struck. Specific chlorosilanes are tetrachlorosilane ($SiCl_4$), trichlorosilane ($HSiC_3$), dichlorosilane ($H_2SiCl_2$), monochlorosilane ($ClSiH_3$), chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, monochlorotrimethylsilane, and the like.

Examples of silicon-containing reactants include siloxanes, alkyl silane or hydrocarbon-substituted silane, or a nitrogen-containing carbon-containing reactant. Example siloxanes include linear siloxanes, cyclic siloxanes, and caged siloxanes. Example siloxanes include 2,4,6,8-tetramethylcyclotetrasiloxane (TMCTS), heptamethylcyclotetrasiloxane (HMCTS), silsesquioxane, disiloxanes, such as pentamethyldisiloxane (PMDSO) and tetramethyldisiloxane (TMDSO), and trisiloxanes such as hexamethyltrisiloxane, heptamethyltrisiloxane. Alkyl silanes include a central silicon atom with one or more alkyl groups bonded to it as well as one or more hydrogen atoms bonded to it. In some embodiments, any one or more of the alkyl groups contain 1-5 carbon atoms. The hydrocarbon groups may be saturated or unsaturated (e.g., alkene (e.g., vinyl), alkyne, and aromatic groups). Examples include but are not limited to trimethylsilane (3MS), triethylsilane, pentamethyl disilamethane (($CH_3)_2Si$—$CH_2$—$Si(CH_3)_3$), and dimethylsilane (2MS). Additionally, disilanes, trisilanes, or other higher silanes may be used in place of monosilanes. In some embodiments, one of the silicon atoms can have a carbon-containing or hydrocarbon group attached to it, and one of the silicon atoms can have a hydrogen atom attached to it. Example carbon-containing reactants including a nitrogen include methyl-substituted disilazanes and trisilazanes, such as tetramethyldisilazane and hexamethyl trisilazane.

Examples of silicon-containing reactants include siloxanes such as cyclotetrasiloxanes such as heptamethylcyclotetrasiloxane (HMCTS) and tetramethylcyclotetrasiloxane. Other cyclic siloxanes can also include but are not limited to cyclotrisiloxanes and cyclopentasiloxanes. For depositing oxygen doped silicon carbide films, other examples of suitable precursors include linear siloxanes such as, but not limited to, disiloxanes, such as pentamethyldisiloxane (PMDSO), tetramethyldisiloxane (TMDSO), hexamethyl trisiloxane, and heptamethyl trisiloxane. For undoped silicon carbide, examples of suitable precursors include monosilanes substituted with one or more alkyl, alkene, and/or alkyne groups containing, e.g., 1-5 carbon atoms. Examples include but are not limited to trimethylsilane (3MS), dimethylsilane (2MS), triethylsilane (TES), and pentamethyldisilamethane. Additionally, disilanes, trisilanes, or other higher silanes may be used in place of monosilanes. An example of one such disilane from the alkyl silane class is hexamethyldisilane (HMDS). Another example of a disilane from the alkyl silane class can include pentamethyldisilane (PMDS). Other types of alkyl silanes can include alkylcarbosilanes, which can have a branched polymeric structure with a carbon bonded to a silicon atom as well as alkyl groups bonded to a silicon atom. Examples include dimethyl trimethylsilyl methane (DTMSM) and bis-dimethylsilyl ethane (BDMSE). For depositing nitrogen doped silicon carbide (SiNC) films, examples of suitable precursors include, e.g., alkyldisilazanes and possibly compounds including amino (—$NH_2$) and alkyl groups separately bonded to one or more silicon atoms. Alkyldisilazanes include silizanes and alkyl groups bonded to two silicon atoms. An example includes 1,1,3,3-tetramethyldisilazane (TMDSN). Inert gas may be provided along with the silicon-containing reactant. In one example, argon is provided at a rate of about 1-20 slm, and nitrogen (e.g., $N_2$) is provided at a rate of about 0 slm to about 30 slm. In addition, hydrogen ($H_2$) may be provided at a flow rate of about 0 slm to about 5 slm. The pressure in the reaction chamber may be maintained about 0.6 Torr to about 20 Torr. The substrate may be positioned on a temperature-controlled substrate support, which may be maintained at a temperature of about 150° C. to about 650° C.

During the purge operation and the second purge operation, the reaction chamber may be evacuated and/or swept with non-reactive gas to remove non-adsorbed reactants and reaction byproducts. Other gases may be present in the purge gas, as well. In one example, the purge gas includes argon at a flow rate of about 1 slm to about 20 slm, nitrogen (e.g., $N_2$) at a flow rate of about 0 slm to about 30 slm, hydrogen (e.g., $H_2$) at a flow rate of about 0 slm to about 5 slm, oxygen (e.g., $O_2$) at a flow rate of about 0 slm to about 5 slm, and nitrous oxide (e.g., $N_2O$) at a flow rate of about 0 slm to about 5 slm. The chamber pressure and substrate support temperature may be as described above in relation to the dose operation.

During the oxidation operation, the surface of the substrate is oxidized and cleaned with RF plasma. Gases may flow to the reaction chamber, including at least one oxygen-containing reactant. Example oxygen-containing reactants include, but are not limited to, oxygen ($O_2$), nitrous oxide ($N_2O$), ozone ($O_3$), carbon monoxide (CO), carbon dioxide ($CO_2$), etc. Other gases may be provided, as well. In one example, the following gases may be provided during the oxidation operation: argon at a flow rate of about 1-20 slm, nitrogen (e.g., $N_2$) at a flow rate of about 0 slm to about 30 slm, hydrogen (e.g., $H_2$) at a flow rate of about 0 slm to about 5 slm, oxygen (e.g., $O_2$) at a flow rate of about 0.5 slm to about 5 slm, and nitrous oxide (e.g., $N_2O$) at a flow rate of about 0 slm to about 5 slm. RF power may be provided in the range of about 500 W to about 6000 W for a 4-station chamber. The pressure and temperature may be as described above in relation to the dose operation.

In cases where an inhibition operation is used (e.g., see inhibition operation 110 of FIG. 1C), one or more of the following conditions may be used during the inhibition operation. An inhibition gas may be provided to the reaction chamber at a flow rate between about 10 sccm to about 300 sccm. Examples of inhibition gas species include nitrogen species, halogen species, and hydrogen species. However, any species that adsorb onto, react with, or otherwise interact with the substrate surface to passivate it and inhibit subsequent deposition may be used. In various embodiments, the inhibition operation may be a plasma-based inhibition or a thermally-based inhibition. During a plasma-based inhibition, the structure is exposed to a plasma generated from an inhibition gas to form inhibitor species, also referred to as inhibition species. Examples of inhibition gases include nitrogen-containing gases, halogen-containing gases, and hydrogen-containing gases. Specific examples include nitrogen trifluoride ($NF_3$), molecular nitrogen ($N_2$), molecular hydrogen ($H_2$), ammonia ($NH_3$), amines, diols, diamines, aminoalcohols, thiols or combinations thereof. In some embodiments, the inhibition gas is a fluorine-containing gas, such as $NF_3$, $CH_xF_y$, where x+y=4 and y is an integer greater of equal to 1, and sulfur hexafluoride ($SF_6$). In some embodiments, the inhibition operation may be a thermal-based inhibition process. For example, the inhibition operation may be performed by exposing the structure to a gas that includes an inhibition species under conditions where the inhibition species reacts with the surface of the substrate (e.g., without exposing the substrate to plasma during the inhibition operation).

In some embodiments, an inhibition plasma is generated from a halogen-containing gas. Examples include $NF_3$, $CH_3F$, $CH_2F_2$, $CHF_3$, $CF_4$, $SF_6$, $CH_3Cl$, $CH_2Cl_2$, $CHCl_3$, and $CCl_4$. This results in —F, —Cl, or other halogen terminated surfaces throughout the depth of the gap (but most particularly near the top of the sidewalls) that passivate the surface and inhibit subsequent deposition. The halogen-containing gas or other inhibition gas may be about 0.5% to about 10%, about 1 to about 5%, or about 2% of the total volumetric flow to the chamber or other plasma generation space during the inhibition operation 110, with the remaining flow being an inert gas such as $N_2$, Ar, and He.

In cases where plasma is used, the plasma may be generated at an RF power level about 500 W to about 2000 W for a 4-station chamber. The substrate may be exposed to the plasma for a duration of about 0.1 second to about 10 seconds. The substrate support temperature may be about 200° C. to about 650° C. The pressure in the reaction chamber may be about 0.6 Torr to about 10 Torr.

In cases where an etch operation is used (e.g., see etch operation 120 in FIG. 1D), one or more of the following conditions may be used during the etch operation. An etch gas may be provided to the reaction chamber at a flow rate of about 50 sccm to about 500 sccm. In one example, the etch gas includes $NF_3$. In other cases, other etch gases may be used. In various embodiments, the etch gas may include nitrogen and/or a halogen such as fluorine or chlorine. Other gases may be provided to the reaction chamber as well, for example one or more of the gases described above in relation to the inhibition operation 110. Generally, many of the same gases may be used for inhibition and etching, with lower flow rates typically resulting in inhibition and higher flow rates typically resulting in etching. The substrate may be exposed to plasma generated from the etch gas and/or other gases. The plasma may be generated at an RF power level about 750 W to about 8000 W for a 4-station chamber. The substrate may be exposed to the plasma for a duration of about 1 second to about 300 seconds. The substrate support temperature may be about 200° C. to about 650° C. The pressure in the reaction chamber may be about 0.6 Torr to about 2 Torr.

In cases where deposition occurs through chemical vapor deposition (e.g., see FIG. 1E), one or more of the following conditions may be used. The substrate may be simultaneously exposed to a first reactant (e.g., a silicon-containing reactant such as any of those described above) and to a second reactant (e.g., an oxygen-containing reactant such as any of those described above). At the same time, the substrate may be exposed to an energy source (e.g., thermal energy and/or plasma energy) to drive a gas phase reaction between the first and second reactants. This reaction produces a silicon-containing material, which is deposited on the substrate surface. The silicon-containing reactant may be provided at a flow rate about 150 sccm to about 900 sccm. The oxygen-containing reactant may be provided at a flow rate about 500 sccm to about 20,000 sccm. The pressure in the reaction chamber may be maintained about 2 Torr to about 20 Torr. Where the reaction is driven by thermal energy, the substrate support may be maintained at a temperature about 550° C. to about 650° C. Where the reaction is driven by plasma energy, the substrate support may be maintained at a temperature of about 200° C. to about 650° C., and the plasma may be generated at an RF power level of about 750 W to about 5000 W for a 4-station chamber. The substrate may be exposed to the first and second reactants, and to the energy source driving the reaction, for a duration of about 0.1 second to about 10 seconds during each cycle (e.g., each cycle including a reactant delivery operation 130 and an impurity reduction operation 105, as shown in FIG. 1E).

Apparatus

The embodiments herein may be practiced on any appropriate apparatus. An appropriate apparatus will include at least a processing chamber, a plasma generator for producing plasma in the processing chamber, and a controller that is configured to cause one or more of the methods described herein.

Figure 2:
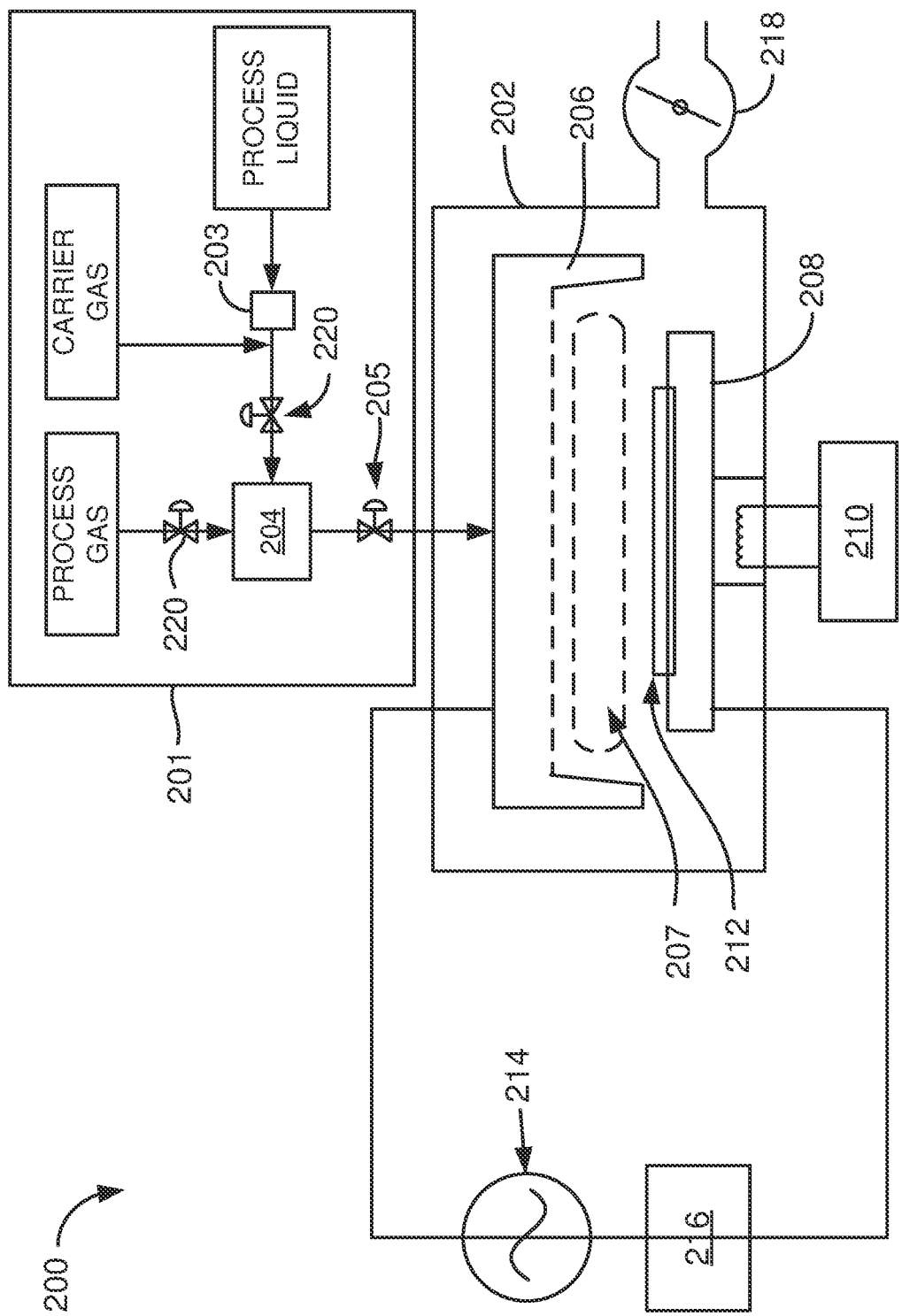
FIG. 2 shows an example process station that may be used to implement the methods described herein.

FIG. 2 schematically shows an embodiment of a process station 200 that may be used to deposit material using atomic layer deposition (ALD), and/or chemical vapor deposition (CVD), either of which may be driven by thermal energy or plasma energy. The process station 200 may be used to practice any of the embodiments described herein, including e.g., those shown in FIGS. 1A-1E. For simplicity, the process station 200 is depicted as a standalone process station having a process chamber body 202 for maintaining a low-pressure environment. However, it will be appreciated that a plurality of process stations 200 may be included in a common process tool environment. Further, it will be appreciated that, in some embodiments, one or more hardware parameters of process station 200, including those discussed in detail below, may be adjusted programmatically by one or more computer controllers.

Process station 200 fluidly communicates with reactant delivery system 201 for delivering process gases to a distribution showerhead 206. Reactant delivery system 201 includes an optional mixing vessel 204 for blending and/or conditioning process gases for delivery to showerhead 206. One or more mixing vessel inlet valves 220 may control introduction of process gases to mixing vessel 204. Similarly, a showerhead inlet valve 205 may control introduction of process gasses to the showerhead 206. In another example, the reactant delivery system 201 may maintain the reactants separate from one another until delivery to inside the chamber body 202.

Some reactants, like BTBAS, may be stored in liquid form prior to vaporization at and subsequent delivery to the process station. For example, the embodiment of FIG. 2 includes a vaporization point 203 for vaporizing liquid reactant to be supplied to mixing vessel 204. In some embodiments, vaporization point 203 may be a heated vaporizer. The reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 203 may be heat traced. In some examples, mixing vessel 204 may also be heat traced. In one non-limiting example, piping downstream of vaporization point 203 has an increasing temperature profile extending from approximately 100° C. to approximately 150° C. at mixing vessel 204.

In some embodiments, reactant liquid may be vaporized at a liquid injector. For example, a liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 203. In one scenario, a liquid injector may be mounted directly to mixing vessel 204. In another scenario, a liquid injector may be mounted directly to showerhead 206.

In some embodiments, a liquid flow controller upstream of vaporization point 203 may be provided for controlling a mass flow of liquid for vaporization and delivery to process station 200. For example, the liquid flow controller (LFC) may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LFC and the PID controller.

Showerhead 206 distributes process gases toward substrate 212. In the embodiment shown in FIG. 2, substrate 212 is located beneath showerhead 206, and is shown resting on a pedestal 208. It will be appreciated that showerhead 206 may have any suitable shape, and may have any suitable number and arrangement of ports for distributing processes gases to substrate 212.

In some embodiments, a microvolume 207 is located beneath showerhead 206. Performing an ALD and/or CVD process in a microvolume rather than in the entire volume of a process station may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters. This microvolume also impacts productivity throughput. While deposition rate per cycle drops, the cycle time also simultaneously reduces. In certain cases, the effect of the latter is dramatic enough to improve overall throughput of the module for a given target thickness of film.

In some embodiments, pedestal 208 may be raised or lowered to expose substrate 212 to microvolume 207 and/or to vary a volume of microvolume 207. For example, in a substrate transfer phase, pedestal 208 may be lowered to allow substrate 212 to be loaded onto pedestal 208. During a deposition process phase, pedestal 208 may be raised to position substrate 212 within microvolume 207. In some embodiments, microvolume 207 may completely enclose substrate 212 as well as a portion of pedestal 208 to create a region of high flow impedance during a deposition process.

Optionally, pedestal 208 may be lowered and/or raised during portions the deposition process to modulate process pressure, reactant concentration, etc., within microvolume 207. In one scenario where process chamber body 202 remains at a base pressure during the deposition process, lowering pedestal 208 may allow microvolume 207 to be evacuated. Example ratios of microvolume to process chamber volume include, but are not limited to, volume ratios about 1:200 to about 1:10. It will be appreciated that, in some embodiments, pedestal height may be adjusted programmatically by a suitable computer controller.

In another scenario, adjusting a height of pedestal 208 may allow a plasma density to be varied during plasma activation and/or treatment cycles included in the deposition process. At the conclusion of the deposition process phase, pedestal 208 may be lowered during another substrate transfer phase to allow removal of substrate 212 from pedestal 208.

While the example microvolume variations described herein refer to a height-adjustable pedestal, it will be appreciated that, in some embodiments, a position of showerhead 206 may be adjusted relative to pedestal 208 to vary a volume of microvolume 207. Further, it will be appreciated that a vertical position of pedestal 208 and/or showerhead 206 may be varied by any suitable mechanism within the scope of the present disclosure. In some embodiments, pedestal 208 may include a rotational axis for rotating an orientation of substrate 212. It will be appreciated that, in some embodiments, one or more of these example adjustments may be performed programmatically by one or more suitable computer controllers.

Returning to the embodiment shown in FIG. 2, showerhead 206 and pedestal 208 electrically communicate with RF power supply 214 and matching network 216 for powering a plasma. In some embodiments, the plasma energy may be controlled by controlling one or more of a process station pressure, a gas concentration, an RF source power, an RF source frequency, and a plasma power pulse timing. For example, RF power supply 214 and matching network 216 may be operated at any suitable power to form a plasma having a desired composition of radical species. Examples of suitable powers are included above. Likewise, RF power supply 214 may provide RF power of any suitable frequency. In some embodiments, RF power supply 214 may be configured to control high- and low-frequency RF power sources independently of one another. Example low-frequency RF frequencies may include, but are not limited to, frequencies about 50 kHz to about 200 kHz. Example high-frequency RF frequencies may include, but are not limited to, frequencies about 1.8 MHz to about 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma process phase may be included in a corresponding plasma activation recipe phase of a deposition process recipe or an impurity reduction process recipe. In some cases, process recipe phases may be sequentially arranged, so that all instructions for a deposition process phase are executed concurrently with that process phase. In some embodiments, instructions for setting one or more plasma parameters may be included in a recipe phase preceding a plasma process phase. For example, a first recipe phase may include instructions for setting a flow rate of an inert and/or a reactant gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In some deposition processes, plasma strikes last on the order of a few seconds or more in duration. In certain implementations, much shorter plasma strikes may be used. These may be on the order of 10 ms to 1 second, typically, about 20 to 80 ms, with 50 ms being a specific example. Such very short RF plasma strikes require extremely quick stabilization of the plasma. To accomplish this, the plasma generator may be configured such that the impedance match is set preset to a particular voltage, while the frequency is allowed to float. High-frequency plasmas may be generated at an RF frequency at about 13.56 MHz. In various embodiments disclosed herein, the frequency is allowed to float to a value that is different from this standard value. By permitting the frequency to float while fixing the impedance match to a predetermined voltage, the plasma can stabilize much more quickly, a result which may be important when using the very short plasma strikes associated with some types of deposition cycles.

In some embodiments, pedestal 208 may be temperature controlled via heater 210. Further, in some embodiments, pressure control for deposition process station 200 may be provided by butterfly valve 218. As shown in the embodiment of FIG. 2, butterfly valve 218 throttles a vacuum provided by a downstream vacuum pump (not shown). However, in some embodiments, pressure control of process station 200 may also be adjusted by varying a flow rate of one or more gases introduced to process station 200.

Figure 3:
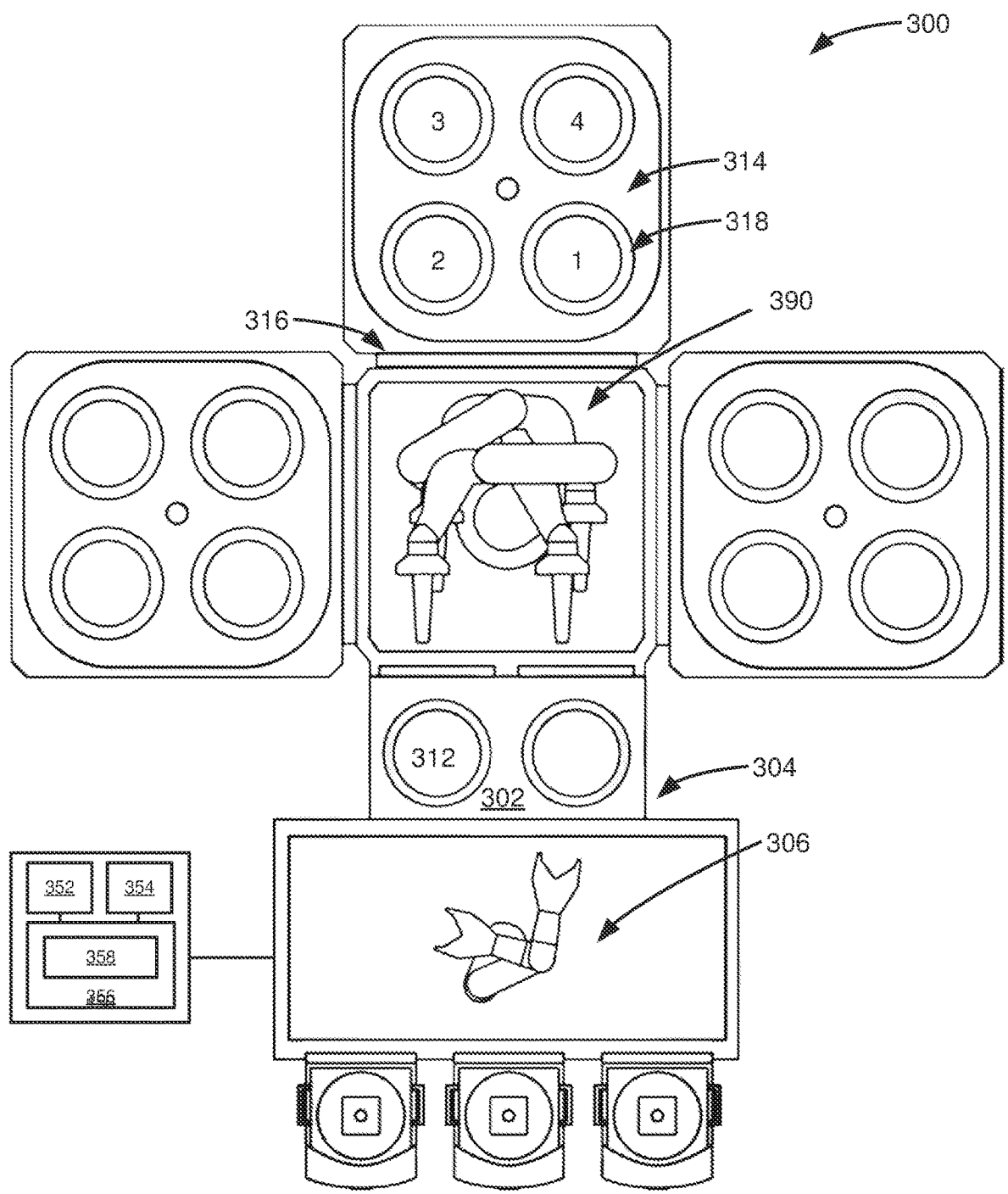
FIG. 3 illustrates an example multi-station processing tool that may be used to implement the methods described herein.

One or more process stations may be included in a multi-station processing tool. FIG. 3 shows a schematic view of an embodiment of a multi-station processing tool 300 with an inbound load lock 302 and an outbound load lock 304, either or both of which may include a remote plasma source. A robot 306, at atmospheric pressure, is configured to move substrates or wafers from a cassette loaded through a pod 308 into inbound load lock 302 via an atmospheric port 310. A substrate is placed by the robot 306 on a pedestal 312 in the inbound load lock 302, the atmospheric port 310 is closed, and the load lock is pumped down. Where the inbound load lock 302 includes a remote plasma source, the substrate may be exposed to a remote plasma treatment in the load lock prior to being introduced into a processing chamber 314. Further, the substrate also may be heated in the inbound load lock 302 as well, for example, to remove moisture and adsorbed gases. Next, a chamber transport port 316 to processing chamber 314 is opened, and another robot (not shown) places the substrate into the reactor on a pedestal of a first station shown in the reactor for processing. While the embodiment depicted in FIG. 3 includes load locks, it will be appreciated that, in some embodiments, direct entry of a substrate into a process station may be provided. In various embodiments, the soak gas is introduced to the station when the substrate is placed by the robot 306 on the pedestal 312.

The depicted processing chamber 314 includes four process stations, numbered from 1 to 4 in the embodiment shown in FIG. 3. Each station has a heated pedestal (shown at 318 for station 1), and gas line inlets. It will be appreciated that in some embodiments, each process station may have different or multiple purposes. For example, in some embodiments, a process station may be switchable between an ALD and PEALD process mode. Additionally or alternatively, in some embodiments, processing chamber 314 may include one or more matched pairs of ALD and plasma-enhanced ALD process stations. While the depicted processing chamber 314 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 3 depicts an embodiment of a wafer handling system 390 for transferring substrates within processing chamber 314. In some embodiments, wafer handling system 390 may transfer substrates between various process stations and/or between a process station and a load lock. It will be appreciated that any suitable wafer handling system may be employed. Non-limiting examples include wafer carousels and wafer handling robots. FIG. 3 also depicts an embodiment of a system controller 350 employed to control process conditions and hardware states of process tool 300. System controller 350 may include one or more memory devices 356, one or more mass storage devices 354, and one or more processors 352. Processor 352 may include a CPU or computer, analog and/or digital input/output connections, stepper motor controller boards, etc. In some embodiments, system controller 350 includes machine-readable instructions for performing operations such as those described herein.

In some embodiments, system controller 350 controls the activities of process tool 300. System controller 350 executes system control software 358 stored in mass storage device 354, loaded into memory device 356, and executed on processor 352. Alternatively, the control logic may be hard coded in the system controller 350. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 358 may include instructions for controlling the timing, mixture of gases, amount of gas flow, chamber and/or station pressure, chamber and/or station temperature, substrate temperature, target power levels, RF power levels, substrate pedestal, chuck and/or susceptor position, and other parameters of a particular process performed by process tool 300. System control software 358 may be configured in any suitable way. For example, various process tool component subroutines or control objects may be written to control operation of the process tool components used to carry out various process tool processes. System control software 358 may be coded in any suitable computer readable programming language.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Experimental

Over the course of several experiments, the inventors have confirmed that the methods described herein may be used to substantially reduce impurities (e.g., F, C, H, and/or N) in silicon oxide film. These results show significant improvement (e.g., one to two orders of magnitude greater reduction in fluorine concentration) compared to previous standard passivation methods, even at much shorter processing times.

Figure 4A:
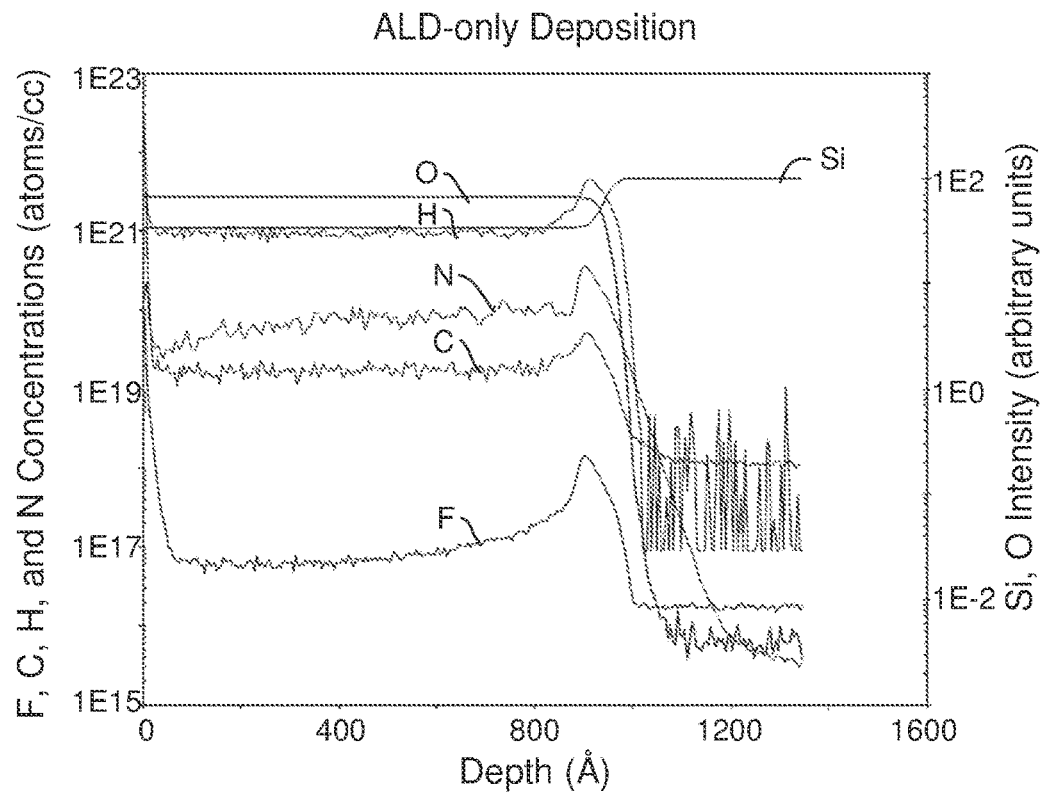
FIGS. 4A-4C depict experimental results related to the concentration of different impurities where the silicon oxide film was deposited using some methods.
Figure 4B:
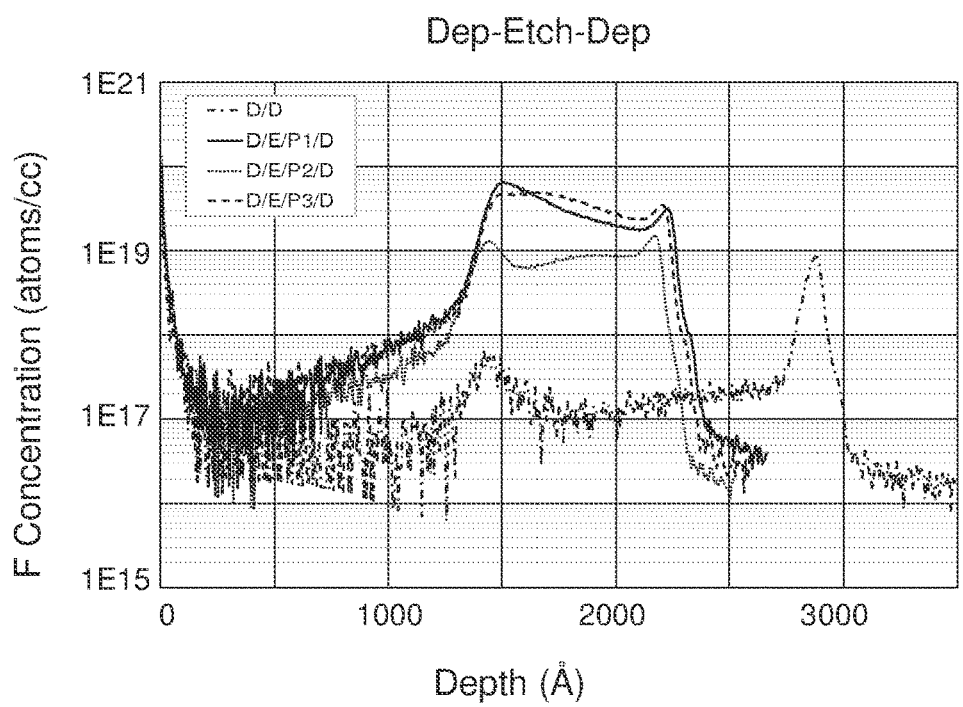
Figure 4C:
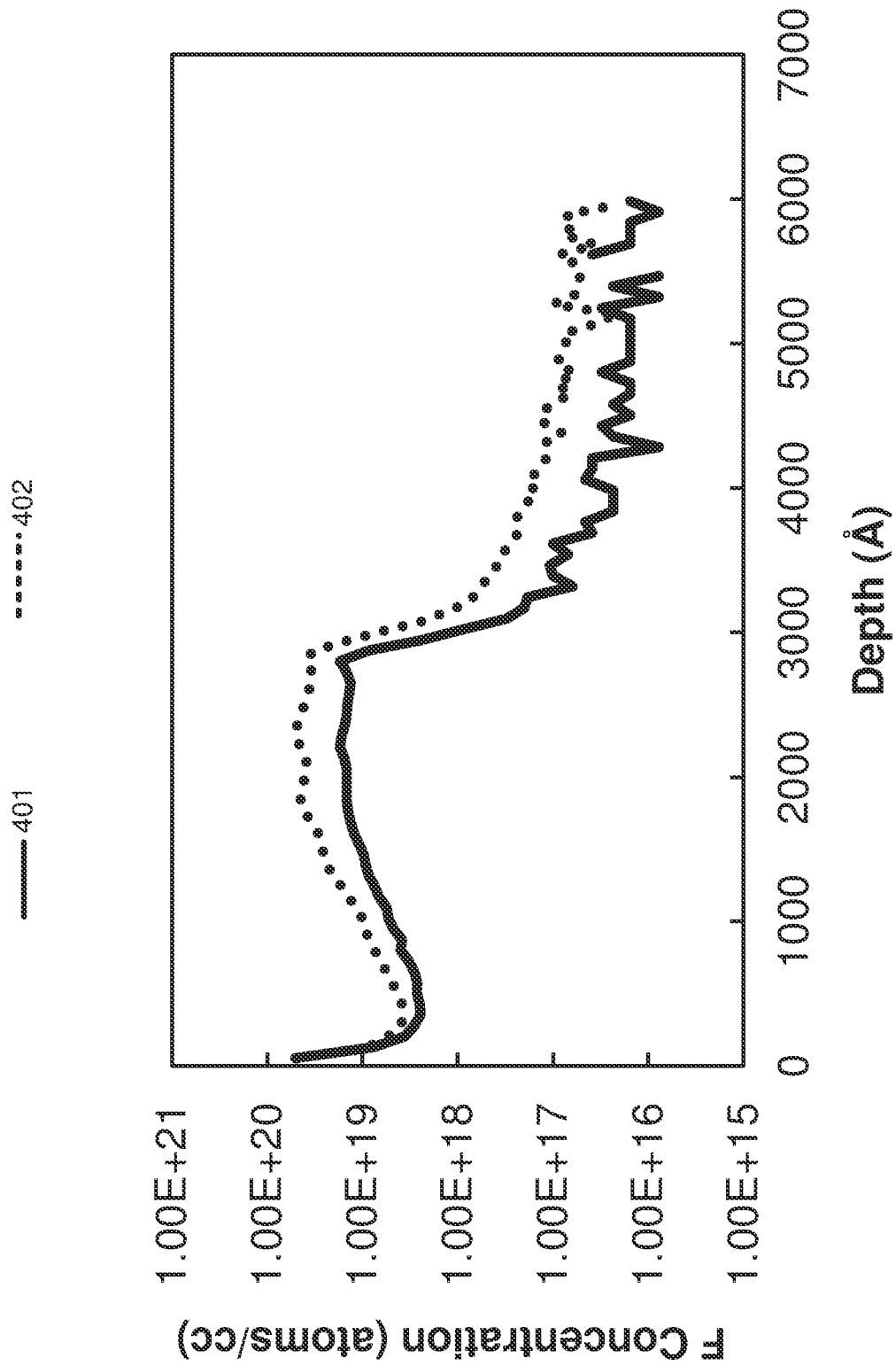

FIGS. 4A-4C show the concentration of fluorine at different depths for silicon oxide films deposited according to some methods. FIG. 4A shows results related to a silicon oxide film deposited using ALD only (e.g., similar to the methods shown in FIGS. 1A and 1B, but without the impurity reduction operation 105). In the ALD-only example of FIG. 4A, the fluorine concentration in the silicon oxide film is on the order of about 1E17 atoms/cc. The results in FIG. 4A show not only the fluorine concentration in the film, but the concentration of carbon, hydrogen, nitrogen, silicon, and oxygen, as well. FIG. 4B shows results related to three silicon oxide films deposited using a deposition-etch-deposition scheme that also utilized a periodic passivation operation without impurity reduction (e.g., similar to the method shown in FIG. 1D, but using a passivation operation without impurity reduction instead of impurity reduction operation 105), as well as one film deposited without any etch or passivation operation. In the example of FIG. 4B, the fluorine concentration in the silicon oxide films is on the order of about 1E18-1E19 atoms/cc, and is highest at the interfaces/depths where the deposition was stopped, e.g., to perform the etch operation. FIG. 4C shows results related to two silicon oxide films 401 and 402 deposited using a deposition-etch-deposition scheme that also utilized a periodic passivation operation without impurity reduction, where the deposition operations were driven by high density plasma (HDP). In this example, the fluorine concentration in the films were on the order of about 5E19 atoms/cc.

Figure 5A:
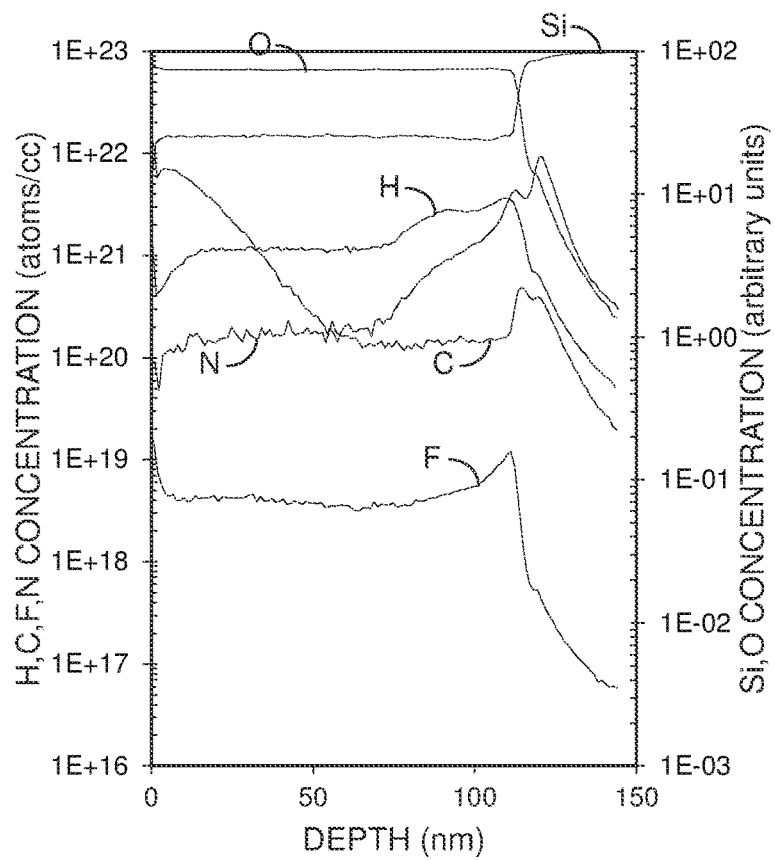
FIGS. 5A and 5B depict experimental results related to the concentration of different impurities where the silicon oxide film was deposited without periodic impurity reduction (FIG. 5A) and with a periodic impurity reduction step (FIG. 5B).
Figure 5B:
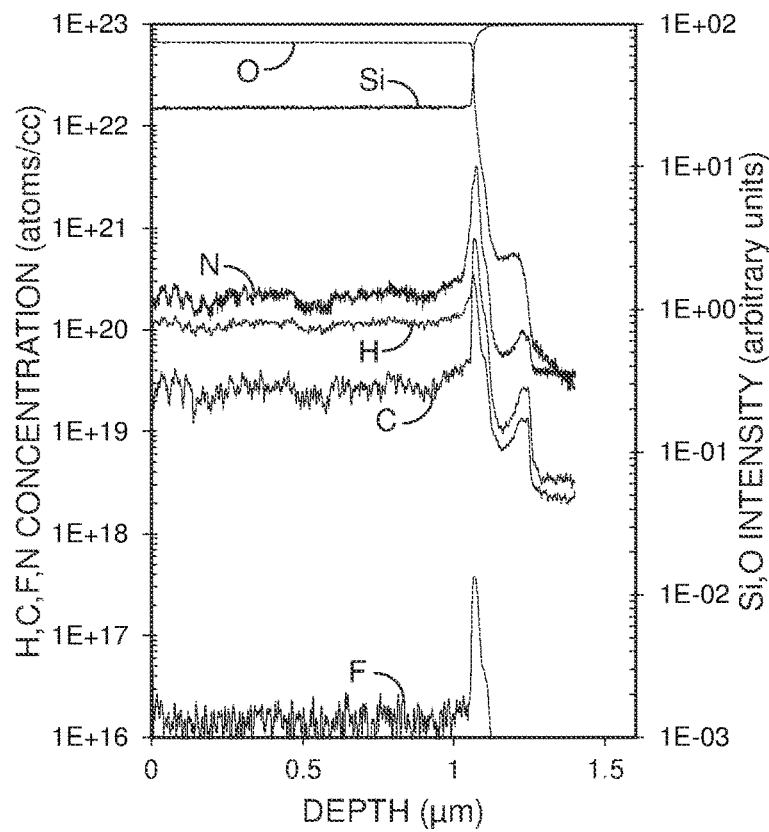

FIGS. 5A and 5B show the concentration of fluorine, carbon, hydrogen, nitrogen, silicon, and oxygen at different depths in silicon oxide films deposited according to various techniques described herein. In FIG. 5A, the silicon oxide film was deposited using continuous thermal CVD, without any impurity reduction operation. In FIG. 5B, the silicon oxide film was deposited using the modified CVD technique described in relation to FIG. 1E, with an impurity reduction operation performed periodically throughout the deposition. The impurity reduction operation was alternated with the chemical vapor deposition operation. The results in FIGS. 5A and 5B are summarized in FIG. 6 and in Tables 1 and 2, below.

Figure 6:
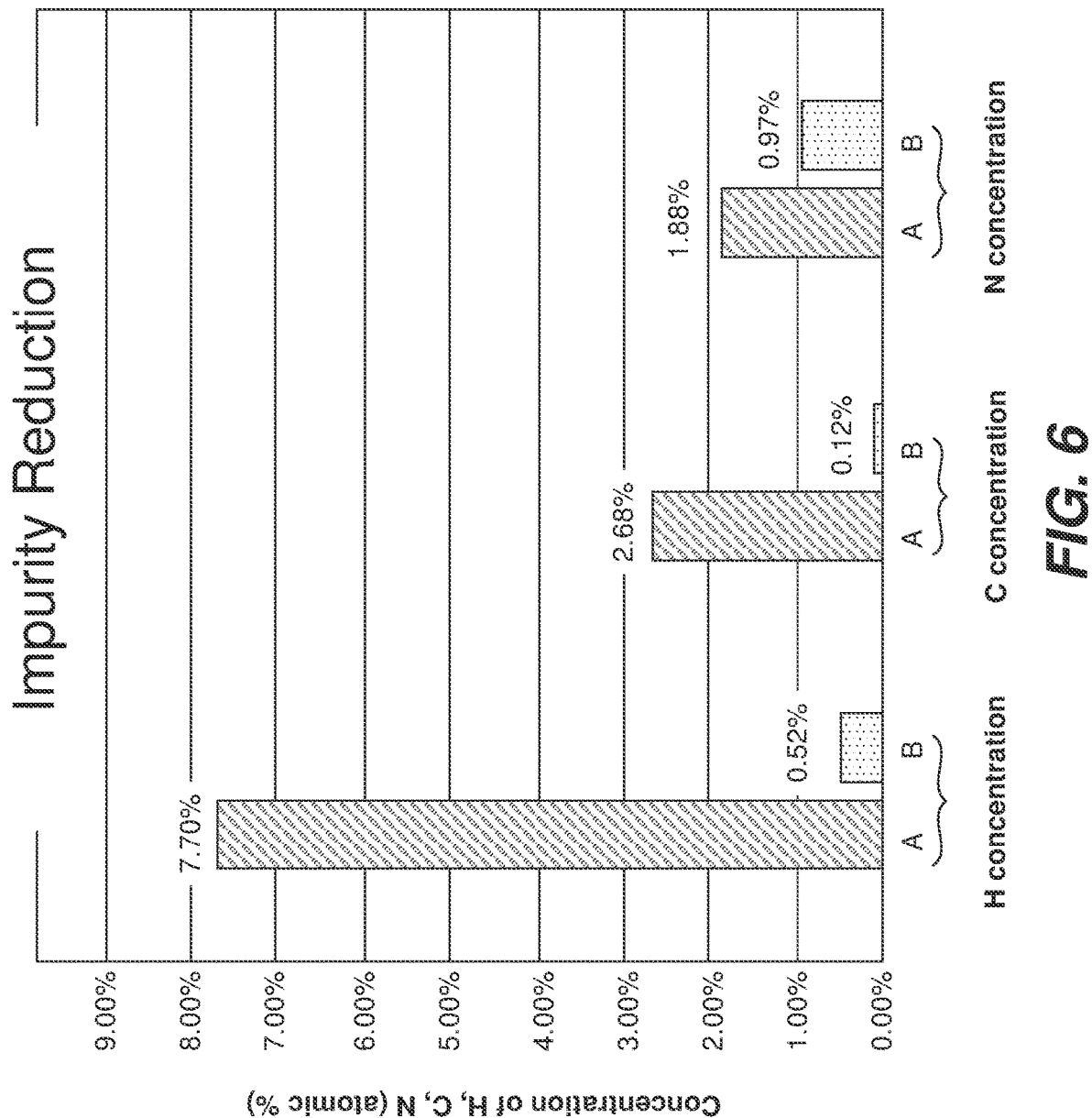
FIG. 6 presents the concentration (in atomic percent) of various impurities, comparing a process without impurity reduction to a process where impurity reduction takes place.

FIG. 6 shows the concentration of carbon, hydrogen, and nitrogen in silicon oxide films deposited as described in relation to FIGS. 5A and 5B. Process A relates to the results shown in FIG. 5A, where the deposition occurred according to a continuous thermal chemical vapor deposition technique that did not involve an impurity reduction operation. Process B relates to the results shown in FIG. 5B, where the deposition occurred according to the modified chemical vapor deposition technique that involved an impurity reduction operation performed periodically during the deposition, as described in relation to FIG. 1E. The reported concentrations in FIG. 6 are the average concentrations, excluding the very top and very bottom edges of the silicon oxide film. As shown in FIG. 6, the impurity reduction operation had a substantial effect on the hydrogen concentration in the silicon oxide film (e.g., reducing from about 7.70% H to about 0.52% H), as well as the carbon concentration in the film (e.g., reducing from about 2.68% C to about 0.12% C). The impurity reduction operation also had a noticeable effect on the nitrogen concentration in the silicon oxide film (e.g., reducing from about 1.88% N to about 0.97% N), though this effect wasn't as substantial as the effect on the hydrogen and carbon concentrations. The values reported in FIG. 6 were based on RBS and SIMS data. Process A produced a silicon oxide film that was about 30.3% silicon and about 62.0% oxygen (e.g., for a total of about 92.3% silicon and oxygen). By contrast, process B produced a silicon oxide film that was about 33.3% silicon and 66.1% oxygen (e.g., for a total of about 99.4% silicon and oxygen). In other words, process B produced a substantially more pure film than process A.

Table 1 shows the concentration of different impurities when comparing process A and process B from FIG. 6. To reiterate, process A relates to the results shown in FIG. 5A, and process B relates to the results shown in FIG. 5B. These results generally match those in FIG. 6, showing substantial reductions in hydrogen concentration and carbon concentration, as well as a more modest reduction in nitrogen concentration, in cases where an impurity reduction operation is used during deposition.

TABLE 1

| Impurity | Process A Impurity Concentration (atoms/cc) | Process B Impurity Concentration (atoms/cc) |
| --- | --- | --- |
| H | 1.53E21 | 1.13E20 |
| C | 5.33E20 | 2.66E19 |
| N | 3.74E20 | 2.12E20 |
| F | 4.96E+18 | 1.40E+16 |

Table 2 presents the concentration of the different impurities shown in Table 1, reported in atomic % rather than atoms/cc. The values in Table 2 match those reported in FIG. 6, and include further information regarding the fluorine concentration in each film.

TABLE 2

| Impurity | Process A Impurity Concentration (atomic %) | Process B Impurity Concentration (atomic %) |
| --- | --- | --- |
| H | 7.70 | 0.52 |
| C | 2.68 | 0.12 |
| N | 1.88 | 0.97 |
| F | 0.3 | 0.00 |

These results provided in this section can be used to quantitatively compare silicon oxide films deposited according to methods without impurity reduction and silicon oxide films deposited according to the disclosed embodiments. Generally speaking, the impurity reduction operation resulted in a 93% decrease in the concentration of hydrogen; a 95% decrease in the concentration of carbon; a 43% decrease in the concentration of nitrogen; and a 99.7% decrease in the concentration of fluorine. These impurity reductions were substantial.

In various embodiments, the silicon oxide film may have any one or more of the following properties. The concentration of fluorine may be on the order of about 1E16 atoms/cc. In some cases, the fluorine concentration may be about 9E16 atoms/cc or less, or about 5E16 atoms/cc or less, or about 2E16 atoms/cc or less, or about 1E16 atoms/cc or less. The concentration of fluorine may be about 0.3% (atomic %) or less, or about ~1E-5% (atomic %) or less. The concentration of carbon may be about 9E19 atoms/cc or less, or about 5E19 atoms/cc or less. The concentration of carbon may be about 2% (atomic %) or less, or about 1% (atomic %), or about 0.5% (atomic %) or less, or about 0.25% (atomic %) or less. The concentration of nitrogen may be about 3E20 atoms/cc or less. The concentration of nitrogen may be about 1.5% (atomic %) or less, or about 1% (atomic %) or less.

Figure 7A:
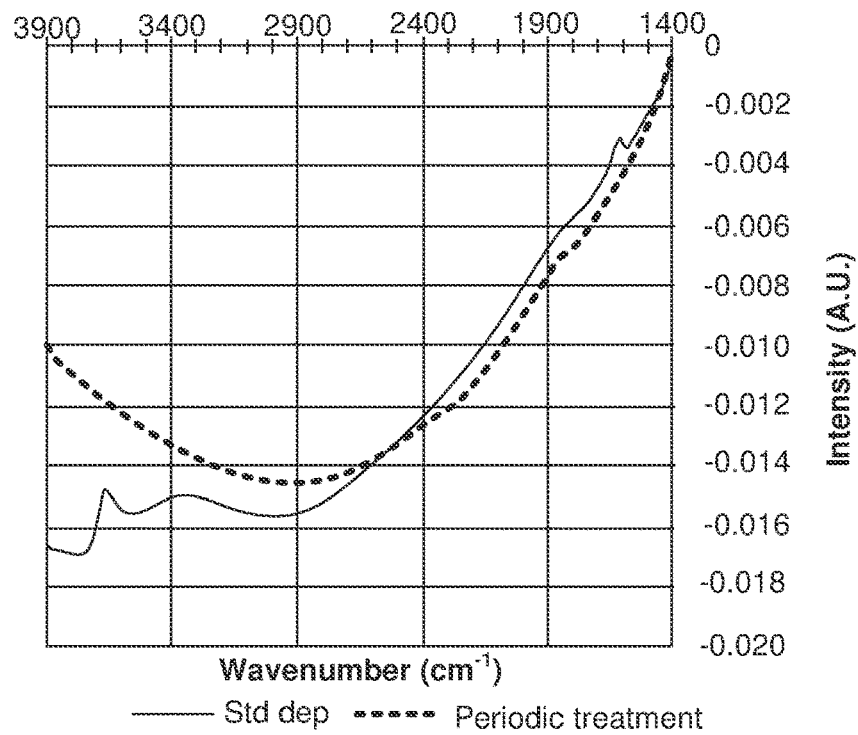
FIGS. 7A and 7B show experimental FTIR data that suggest the impurity reduction described herein results in a decrease in hydrogen-related peaks (FIG. 7A) and an increase in silicon-oxygen related peaks (FIG. 7B).
Figure 7B:
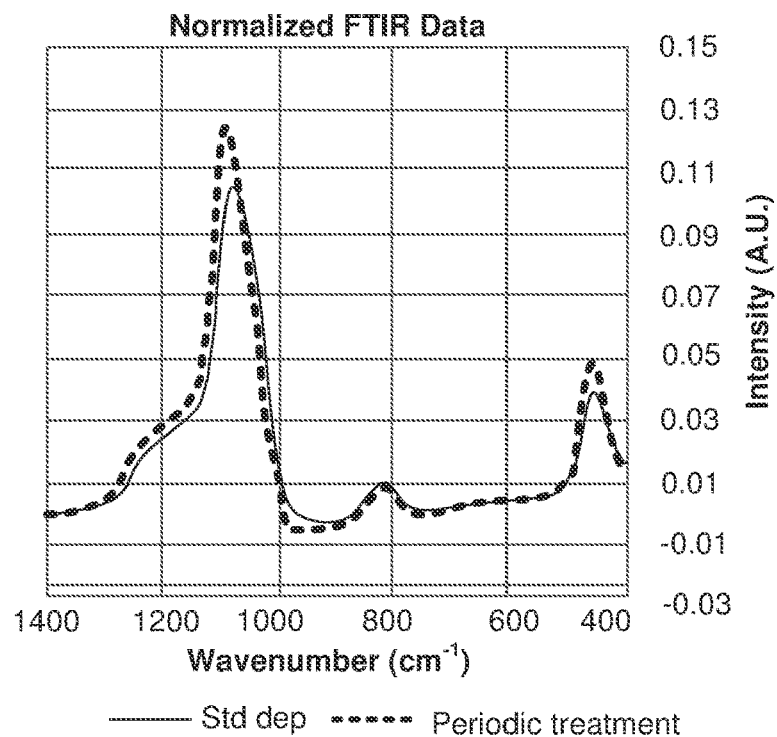

FIGS. 7A and 7B presents FTIR data confirming the periodic impurity reduction operation resulted in a substantial decrease in the concentration of hydrogen in the silicon oxide film (FIG. 7A), as well as an increase in silicon and oxygen concentrations in the silicon oxide film (FIG. 7B). In FIGS. 7A and 7B, "Std dep" refers to a deposition that did not involve an impurity reduction operation, while "periodic treatment" refers to a deposition that involved periodically performing an impurity reduction operation as described above. Hydrogen-related FTIR peaks would be expected at wavenumbers of about 3675 cm$^{-1}$ (related to —OH stretching), 3300 cm$^{-1}$ (related to —OH stretching), and 1615 cm$^{-1}$ (related to H—O—H stretching). As shown in FIG. 7A, the deposition that did not utilize an impurity reduction operation showed noticeable peaks at each of these wavenumbers, indicating the presence of a significant amount of hydrogen in the silicon oxide film. By contrast, where the impurity reduction operation was used, these peaks essentially disappear, indicating that the concentration of hydrogen is much lower. Silicon- and oxygen-related peaks would be expected at wavenumbers of about 1200 cm$^{-1}$ (related to Si—O stretching), 1075 cm$^{-1}$ (related to Si—O—Si stretching), 815 cm$^{-1}$ (related to Si—O bending), and 460 cm$^{-1}$ (related to Si—O being out of plane). As shown in FIG. 7B, both the deposition without impurity reduction and the deposition involving the impurity reduction operation show peaks at these wavenumbers. However, the peaks are higher in the case where the impurity reduction operation was used, indicating that there is relatively more silicon and oxygen present in the silicon oxide film. In other words, there are fewer impurities present, and the silicon oxide film is purer.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method for depositing a doped or undoped silicon-containing film on a substrate, the method comprising:
   (a) exposing the substrate to a first reactant, wherein the first reactant is a silicon-containing reactant;
   (b) reacting at least the first reactant in a first plasma to form a doped or undoped silicon-containing material, and depositing a portion of the doped or undoped silicon-containing film on the substrate, the doped or undoped silicon-containing film having a first impurity concentration;
   (c) before the depositing of the portion of the doped or undoped silicon-containing film is complete, performing an impurity reduction operation comprising:
      (i) generating a second plasma from a plasma generation gas,
         wherein the plasma generation gas comprises inert gas and hydrogen (H$_2$), and
         wherein the plasma generation gas is substantially free of oxygen (O$_2$), and
      (ii) exposing the substrate to the second plasma to thereby reduce the first impurity concentration to a second impurity concentration in the doped or undoped silicon-containing material; and (d) repeating (a) with at least one of (b) or (c) until the doped or undoped silicon-containing film is deposited to a final thickness.

2. The method of claim 1, wherein the impurity is selected from the group consisting of fluorine, carbon, hydrogen, nitrogen, and combinations thereof.

3. The method of claim 1, further comprising (e) exposing the substrate to a second reactant, wherein reacting at least the first reactant comprises reacting the first reactant with the second reactant to form the doped or undoped silicon-containing material, wherein repeating (a) with at least one of (b) or (c) further comprises repeating (e).

4. The method of claim 3, wherein the first reactant and second reactant are introduced to a chamber comprising the substrate simultaneously.

5. The method of claim 3, wherein the second reactant is an oxygen-containing reactant.

6. The method of claim 3, wherein the first reactant and second reactant are introduced to a chamber comprising the substrate in temporally separated pulses.

7. The method of claim 1, wherein the doped or undoped silicon-containing film is deposited in recessed features formed in a surface of the substrate, the method further comprising exposing the substrate to etching chemistry to etch a top portion of the doped or undoped silicon-containing film in the recessed features before the doped or undoped silicon-containing film fully fills the recessed features.

8. The method of claim 1, wherein the doped or undoped silicon-containing film is deposited in recessed features formed in a surface of the substrate, the method further comprising exposing the substrate to inhibition chemistry to selectively inhibit deposition near a top of the recessed features as compared to a bottom and middle of the recessed features.

9. The method of claim 1, wherein the second impurity concentration is less than 10 times the first impurity concentration.

10. The method of claim 1, wherein concentration of fluorine in the doped or undoped silicon-containing film is on the order of about 1E16 atoms/cc once the doped or undoped silicon-containing film reaches the final thickness.

11. The method of claim 1, wherein concentration of carbon in the doped or undoped silicon-containing film is about 1E20 atoms/cc or less once the doped or undoped silicon-containing film reaches the final thickness.

12. The method of claim 1, wherein concentration of carbon in the doped or undoped silicon-containing film is about 2% or less (atomic percent) once the doped or undoped silicon-containing film reaches the final thickness.

13. The method of claim 1, wherein concentration of hydrogen in the doped or undoped silicon-containing film is about 5E20 atoms/cc or less once the doped or undoped silicon-containing film reaches the final thickness.

14. The method of claim 1, wherein concentration of hydrogen in the doped or undoped silicon-containing film is about 5% or less (atomic percent) once the doped or undoped silicon-containing film reaches the final thickness.

15. The method of claim 1, wherein concentration of nitrogen in the doped or undoped silicon-containing film is about 3E20 atoms/cc or less once the doped or undoped silicon-containing film reaches the final thickness.

16. The method of claim 1, wherein concentration of nitrogen in the doped or undoped silicon-containing film is about 1.5% or less (atomic percent) once the doped or undoped silicon-containing film reaches the final thickness.

17. The method of claim 1, wherein generating the plasma in (d)(i) comprises flowing the inert gas at a rate of about 2 slm to about 60 slm, flowing the hydrogen at a rate of about 0.5 slm to about 5 slm, and generating the plasma at an RF power level that includes about 1000 W to about 6000 W HF RF, and about 0 W to about 5000 W LF RF.

18. The method of claim 1, wherein the plasma generation gas comprises nitrogen ($N_2$).

19. The method of claim 1, wherein the first reactant comprises a silane.

20. An apparatus for depositing a doped or undoped silicon-containing film on a substrate, the apparatus comprising:

a processing chamber;

an inlet to the processing chamber for introducing reactants to the processing chamber;

a plasma generator for generating a plasma in the processing chamber; and a controller configured to:

cause the substrate to be exposed to a first reactant, wherein the first reactant is a silicon-containing reactant;

cause reacting of at least the first reactant in a first plasma to form a doped or undoped silicon-containing material, and depositing a portion of the doped or undoped silicon-containing film on the substrate, the doped or undoped silicon-containing film having a first impurity concentration;

before the depositing of the portion of the doped or undoped silicon-containing film is complete, cause an impurity reduction operation comprising:

(i) causing generation of a second plasma from a plasma generation gas,
wherein the plasma generation gas comprises inert gas and hydrogen ($H_2$), and
wherein the plasma generation gas is substantially free of oxygen ($O_2$), and (ii) causing exposure of the substrate to the second plasma to thereby reduce the first impurity concentration to a second impurity concentration in the doped or undoped silicon-containing material; and (d) causing repeating of (a) with at least one of (b) or (c) until the doped or undoped silicon-containing film is deposited to a final thickness.

* * * * *